US009643358B2

(12) United States Patent
Lewis et al.

(10) Patent No.: US 9,643,358 B2
(45) Date of Patent: May 9, 2017

(54) MULTINOZZLE DEPOSITION SYSTEM FOR DIRECT WRITE APPLICATIONS

(75) Inventors: Jennifer A. Lewis, Cambridge, MA (US); Christopher J. Hansen, Lowell, MA (US); Steven Kranz, Urbana, IL (US); John J. Vericella, Champaign, IL (US); Willie Wu, Hillsboro, OR (US); David B. Kolesky, Cambridge, MA (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 399 days.

(21) Appl. No.: 14/128,905

(22) PCT Filed: Jun. 29, 2012

(86) PCT No.: PCT/US2012/044794
§ 371 (c)(1),
(2), (4) Date: Jul. 8, 2014

(87) PCT Pub. No.: WO2013/006399
PCT Pub. Date: Jan. 10, 2013

(65) Prior Publication Data
US 2014/0314954 A1 Oct. 23, 2014

Related U.S. Application Data

(60) Provisional application No. 61/537,956, filed on Sep. 22, 2011, provisional application No. 61/503,983, filed on Jul. 1, 2011.

(51) Int. Cl.
*B29C 67/00* (2006.01)
*B41J 2/14* (2006.01)
*B41J 2/16* (2006.01)

(52) U.S. Cl.
CPC ...... *B29C 67/0059* (2013.01); *B29C 67/0085* (2013.01); *B41J 2/14* (2013.01); *B41J 2/1623* (2013.01); *B81B 2201/058* (2013.01)

(58) Field of Classification Search
None
See application file for complete search history.

(56) References Cited

U.S. PATENT DOCUMENTS 1,401,504 A * 12/1921 Sykora ............... B01F 15/0264
118/109
6,183,078 B1 * 2/2001 Pietrzyk ............... B41J 2/1404
347/40
(Continued)

FOREIGN PATENT DOCUMENTS

WO  WO 2013/096664 A1  6/2013
WO  WO 2014/182535 A1  11/2014
(Continued)

OTHER PUBLICATIONS

International Search Report for International PCT Application No. PCT/US2012/044794, mailing date Sep. 17, 2012, pp. 1-4.
(Continued)

*Primary Examiner* — Michael P Rodriguez
(74) *Attorney, Agent, or Firm* — Brinks Gilson & Lione

(57) ABSTRACT

A multinozzle deposition system for direct write applications comprises a body including a first network of microchannels embedded therein, where the first network of microchannels extends from a parent microchannel through a series of furcations to a plurality of branching microchannels. The series consists of k generations with furcation number m where the $k^{th}$ generation includes $m^k$ branching microchannels. A first end of the body includes a single inlet to the parent microchannel and a second end of the body includes $m^k$ outlets from the branching microchannels, where k is an integer greater than or equal to 1 and m is an (Continued)

integer greater than or equal to 2. The body comprises a material having a sufficient rigidity to sustain a pressure in the microchannels of about 690 kPa or greater without distortion.

10 Claims, 25 Drawing Sheets

(56) References Cited

U.S. PATENT DOCUMENTS

| | | | |
|---|---|---|---|
| 7,007,710 | B2 | 3/2006 | Heller et al. |
| 7,053,125 | B2 | 5/2006 | Lewis et al. |
| 7,141,617 | B2 | 11/2006 | Gratson et al. |
| 7,790,061 | B2 | 9/2010 | Gratson et al. |
| 7,799,251 | B2 | 9/2010 | Therriault et al. |
| 7,922,939 | B2 | 4/2011 | Lewis et al. |
| 7,956,102 | B2 | 6/2011 | Lewis et al. |
| 8,101,139 | B2 | 1/2012 | Therriault et al. |
| 8,187,500 | B2 | 5/2012 | Lewis et al. |
| 2003/0075491 | A1 | 4/2003 | Griffiths |
| 2003/0090034 | A1 | 5/2003 | Mülhaupt et al. |
| 2004/0195392 | A1* | 10/2004 | Miinalainen ............ B05C 11/10 239/565 |
| 2007/0008390 | A1 | 1/2007 | Cruchon-Dupeyrat et al. |
| 2007/0172588 | A1 | 7/2007 | Therriault et al. |
| 2009/0035664 | A1 | 2/2009 | Chiang et al. |
| 2010/0174124 | A1 | 7/2010 | Tonkovich et al. |
| 2010/0330220 | A1 | 12/2010 | Gratson et al. |
| 2011/0045346 | A1 | 2/2011 | Chiang et al. |
| 2011/0267738 | A1 | 11/2011 | Lee et al. |
| 2013/0084449 | A1 | 4/2013 | Lewis et al. |
| 2014/0314954 | A1 | 10/2014 | Lewis et al. |

FOREIGN PATENT DOCUMENTS

| | | |
|---|---|---|
| WO | WO 2014/209994 A2 | 12/2014 |
| WO | WO 2015/069619 A1 | 5/2015 |
| WO | WO 2015/073944 A2 | 5/2015 |
| WO | WO 2015/120429 A1 | 8/2015 |
| WO | WO 2015/120430 A1 | 8/2015 |

OTHER PUBLICATIONS

Abate, Adam R. et al., "Faster Multiple Emulsification with Drop Splitting," *Lab Chip* 11 (2011) pp. 1911-1915.
Ahn, Bok Y. et al., "Omnidirectional Printing of Flexible, Stretchable, and Spanning Silver Microelectrodes," *Science*, 323 (2009) pp. 1590-1593.
Calvert, Paul, "Inkjet Printing for Materials and Devices," *Chem. Mater.*, 13, 10 (2001) pp. 3299-3305.
Conley, J. G. et al., "Rapid Prototyping and Solid Free Form Fabrication," *Journal of Manufacturing Science and Engineering*, 119 (1997) pp. 811-816.
Emerson, David. R. et al., "Biomimetic Design of Microfluidic Manifolds Based on a Generalised Murray's Law," *Lab Chip*, 6 (2006) pp. 447-454.
Gratson, Gregory M. et al. "Direct Writing of Three-Dimensional Webs," *Nature*, 428 (2004) p. 386.
Griffith, Linda G. et al., "Tissue Engineering—Current Challenges and Expanding Opportunities," *Science*, 295 (2002) pp. 1009-1014.
Huo, Fengwei et al., "Polymer Pen Lithography," *Science*, 321 (2008) pp. 1658-1660.
Hutmacher, Dietmar W. et al., "Scaffold-based tissue engineering: rationale for computer-aided design and solid free-form fabrication systems," *TRENDS in Biotechnology*, 22, 7 (2004) pp. 354-362.
Kozola, Brian D. et al., "Characterization of Active Cooling and Flow Distribution in Microvascular Polymers," *Journal of Intelligent Material Systems and Structures*, 21(2010) pp. 1147-1156.
Ladd, Mitchell R. et al., "Co-electrospun dual scaffolding system with potential for muscle-tendon junction tissue engineering," *Biomaterials*, 32 (2011) pp. 1549-1559.
Lakes, Roderic, "Foam Structures with a Negative Poisson's Ratio," *Science*, 235 (1987) pp. 1038-1040.
Lewis, Jennifer A., "Colloidal Processing of Ceramics," *Journal of the American Ceramic Society*, 83, 10 (2000) pp. 2341-2359.
Lewis, Jennifer A. "Direct Ink Writing of 3D Functional Materials," *Adv. Funct. Mater.*, 16 (2006) pp. 2193-2204.
Lim, Daniel et al., "Fabrication of microfluidic mixers and artificial vasculatures using a high-brightness diode-pumped Nd:YAG laser direct write method," *Lab Chip*, 3 (2003) pp. 318-323.
McDonald, J. Cooper et al., "Fabrication of microfluidic systems in poly(dimethylsiloxane)," *Electrophoresis*, 21 (2000) pp. 27-40.
Murray, Cecil D., "The Physiological Principle of Minimum Work. I. The Vascular System and the Cost of Blood Volume," *Proceedings of the National Academy of Sciences of the United States of America*, 12, 3 (1926) pp. 207-214.
Roberts, Mark T. et al., "Direct Flow Visualization of Colloidal Gels in Microfluidic Channels," *Langmuir*, 23 (2007) pp. 8726-8731.
Schonbrun, Ethan et al., "High-Throughput Fluorescence Detection Using an Integrated Zone-Plate Array," *Lab Chip*, 10 (2010) pp. 852-856.
Sherman, Thomas F., "On Connecting Large Vessels to Small—The Meaning of Murray's Law," *The Journal of General Physiology*, 78 (1981) pp. 431-453.
Shim, Wooyoung et al., "Hard-tip, soft-spring lithography," *Nature*, 469 (2011) pp. 516-520.
Srivastava, Yasmin et al., "Electrospinning of Hollow and Core/Sheath Nanofibers Using a Microfluidic Manifold," *Microfluid Nanofluid*, (2007) 6 pages.
Sun, C. et al., "Projection micro-stereolithography using digital micro-mirror dynamic mask," *Sensors and Actuators A*, 121 (2005) pp. 113-120.
Therriault, Daniel et al., "Rheological Behavior of Fugitive Organic Inks for Direct-Write Assembly," *Applied Rheology*, 17, 1 (2007) pp. 10112-1-10112-8.
Yang, Shoufeng, et al., "The Design of Scaffolds for Use in Tissue Engineering. Part II. Rapid Prototyping Techniques," *Tissue Engineering*, 8, 1(2002) pp. 1-11.
Wu, Willie, et al., "Omnidirectional Printing of 3D Microvascular Networks," *Advanced Materials*, 23, 24 (2011) pp. H178-H183.
Yoon, Jongseung et al., "Ultrathin silicon solar microcells for semitransparent, mechanically flexible and microconcentrator module designs," *Nature Materials*, 7 (2008) pp. 907-915.
Zhan, Naiqian et al., "A novel multinozzle electrospinning process for preparing superhydrophobic PS films with controllable bead-on-string/microfiber morphology," *Journal of Colloid and Interface Science*, 345 (2010) pp. 491-495.

\* cited by examiner

MULTINOZZLE DEPOSITION SYSTEM FOR DIRECT WRITE APPLICATIONS

RELATED APPLICATIONS

The present patent document is the U.S. national stage of International Patent Application PCT/US2012/044794, which was filed on Jun. 29, 2012, and which claims priority to U.S. Provisional Patent Application Ser. No. 61/537,956, which was filed on Sep. 22, 2011, and to U.S. Provisional Patent Application Ser. No. 61/503,983, which was filed on Jul. 1, 2011. All of the preceding patent applications are hereby incorporated by reference in their entirety.

TECHNICAL FIELD

The present disclosure is related generally to direct write process technology and more particularly to a multinozzle deposition system for high-throughput printing.

BACKGROUND

Additive manufacturing encompasses a class of fabrication techniques in which structures are built in a "bottom up" mode. This paradigm is gaining acceptance as a low-cost production method for custom-designed components. However, additive fabrication remains a relatively slow process that is often materials-limited.

To enable high throughput patterning, several techniques have been recently modified to incorporate parallelization schemes. For example, inkjet printing utilizes silicon-based microfluidic printheads to eject microscale droplets via resistance heating or piezoelectric transducers. Massively parallel variants of dip pen nanolithography, such as polymer pen lithography and hard-tip, soft-spring lithography, use multi-tip arrays composed of silicon or PDMS that deposit a low viscosity ink on a substrate to yield 2D nanoscale patterns. Parallel electrospinning simultaneously deposits nanofibers onto a substrate from independent and separate nozzles. Projection micro-stereolithography, a layer-by-layer manufacturing approach, enables fabrication via a digital micro-mirror dynamic mask, which selectively polymerizes voxels in parallel. Each of these techniques, however, requires either low viscosity inks with dilute concentrations of the desired material or a restricted set of photocurable resins.

The ability to pattern highly concentrated fluids, resins, pastes and gels in a high throughput manner would expand the palette of desirable materials and facilitate the creation of structures that exhibit minimal shrinkage and deformation. The possibility of large scale, rapid production of planar and 3D microstructured components may have broad relevance to fields such as printed electronics, solar cells, microfluidics, polishing media, novel composites, and tissue engineering.

BRIEF SUMMARY

A multinozzle deposition system for direct write applications and a method of fabricating the multinozzle deposition system have been developed. The system and method enable printing of parallel filamentary features in a high-throughput manner using high viscosity and/or gelled inks as well as traditional low viscosity fluids and resins. The high-throughput process is capable of providing large area printed substrates (e.g., as high as 1 m² in area or higher).

The system comprises a body including a first network of microchannels embedded therein, where the first network of microchannels extends from a parent microchannel through a series of bifurcations to a plurality of branching microchannels. The series consists of k generations with furcation number m where the $k^{th}$ generation includes $m^k$ branching microchannels. A first end of the body includes a single inlet to the parent microchannel and a second end of the body includes $m^k$ outlets from the branching microchannels, where k is an integer greater than or equal to 1, and the furcation number m is an integer greater than or equal to 2. Preferably, the branching microchannels have equal resistance to fluid flow. The body comprises a material having a sufficient rigidity to sustain a pressure in the microchannels of about 100 psi (about 690 kPa) or greater without distortion.

The method of fabricating the multinozzle deposition system includes providing a first block of material and selectively removing some of the material from a surface of the first block to form a network of microchannels therein. The network extends laterally across the first block and each microchannel has a depth smaller than a thickness of the first block. A fugitive material may be deposited into the microchannels, and a second block of material is provided. The surface of the first block and a surface of the second block are bonded together to form a monolithic body having the network of microchannels embedded therein. A single inlet to the network of microchannels is defined at a first end of the monolithic body and a plurality of outlets from the network are defined at a second end of the monolithic body. Finally, the optional fugitive material may be removed from the microchannels, thereby fabricating a multinozzle deposition system.

The method of high-throughput printing includes (1) providing a multinozzle deposition system comprising: a body including a first network of microchannels embedded therein, the first network of microchannels extending from a parent microchannel through a series of furcations to a plurality of branching microchannels, the series consisting of k generations with furcation number m where the $k^{th}$ generation includes $m^k$ branching microchannels, a first end of the body including a single inlet to the parent microchannel and a second end of the body including $m^k$ outlets from the branching microchannels, where k is an integer greater than or equal to 1 and where m is an integer greater than or equal to 2, the outlets being positioned proximate a substrate; (2) flowing a first ink into the single inlet, the ink passing through the first network of microchannels and through the outlets; (3) depositing $m^k$ filaments of the first ink simultaneously on the substrate at a printing speed of at least about 1 mm/s. The printing speed may also be about 20 mm/s or higher, or, in some embodiments, 40 mm/s or higher. In some cases, the body may also include a second network of microchannels embedded therein, so as to enable simultaneous printing of $m^k$ filaments of a second ink on the substrate.

DETAILED DESCRIPTION

Direct-write assembly is a filamentary printing technique that is compatible with numerous highly concentrated ink systems and offers the flexibility to pattern complex 3D shapes over sub-micron to millimeter feature length scales. To date, this versatile technique has been restricted to serial deposition from a single nozzle. To overcome the lengthy fabrication times needed to create large-scale structures, the inventors have developed a multinozzle deposition system that enables highly parallelized deposition of concentrated ink filaments. A 64-nozzle deposition system (or printhead) is employed to demonstrate uniform printing of parallel filament arrays over areas of ~1 m² using fugitive organic inks and photocurable resins, and even larger deposition systems are possible (e.g., 128 nozzles or more). The printing times may be reduced by nearly two orders of magnitude compared with those achieved using a single nozzle.

The multinozzle printheads described here mimic natural microvascular networks in which a large (parent) microchannel is repeatedly furcated into ever-smaller child branches. Specifically, the printheads distribute inks from a centralized reservoir (or ink source) through a parent microchannel to multiple distributed nozzles (or outlets) and may conform to Murray's Law, as discussed further below.

Figure 1:
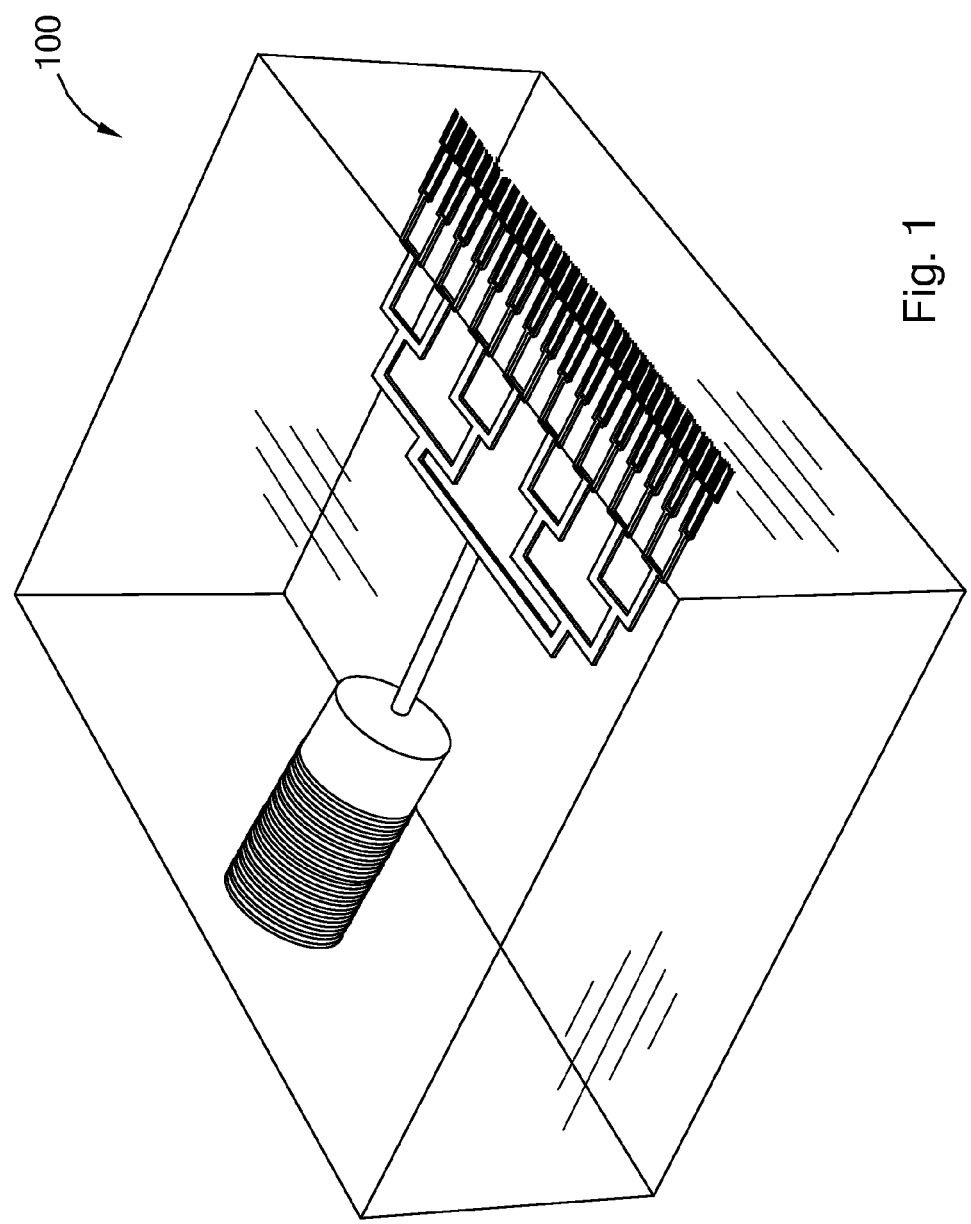
FIG. 1 is a schematic of an exemplary multinozzle deposition system including one embedded network of microchannels.
Figure 2:
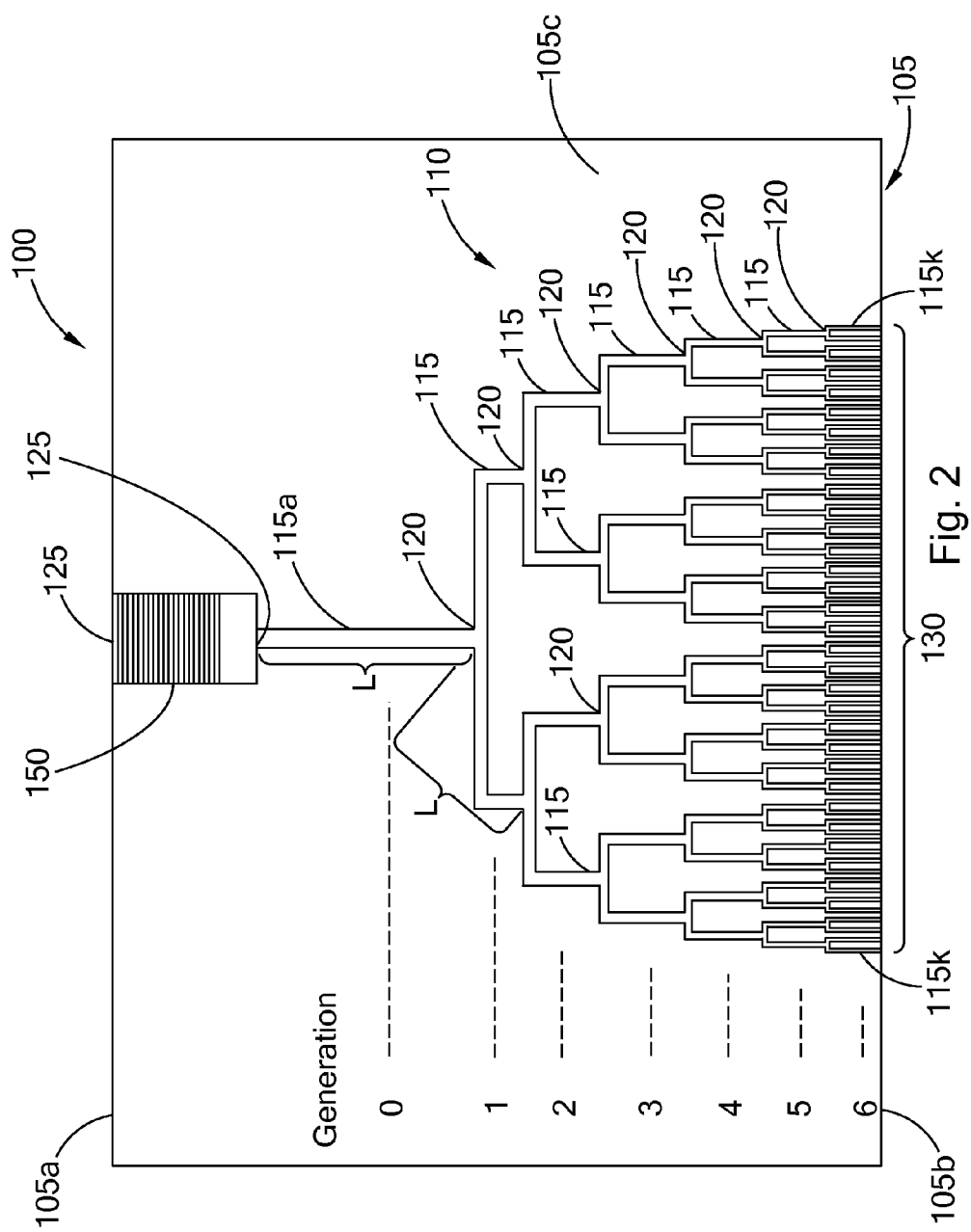
FIG. 2 is a top-view of the multinozzle deposition system shown in FIG. 1.

Referring to FIGS. 1 and 2, the multinozzle deposition system 100 comprises a body 105 in which a network 110 of microchannels 115 is embedded. The network 110 (which may be referred to as a first network 110) extends from parent microchannel 115a through a series of bifurcations 120 to a plurality of branching microchannels 115. For a bifurcating microvascular network consisting of k generations, the final ($k^{th}$) generation has a total of $2^k$ branches, where k is an integer greater than or equal to 1. For a microvascular network with furcation number m, the final generation would have a total of $m^k$ branches. In the exemplary deposition system shown in FIG. 1, k is equal to 6 and m is equal to 2.

Figure 3A:
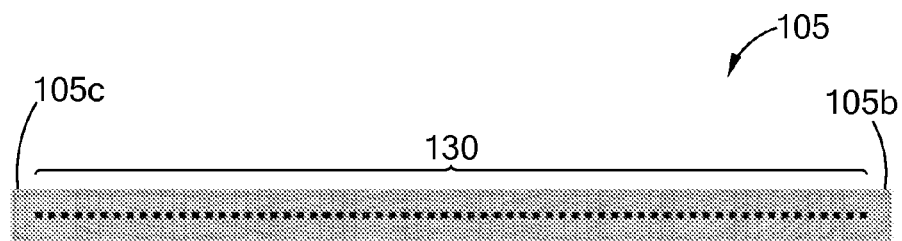
FIGS. 3a and 3b are optical micrographs showing a side view of a portion of an exemplary multinozzle deposition system revealing outlets of the microchannels (scale bar is 500 microns (FIG. 3b))
Figure 3B:
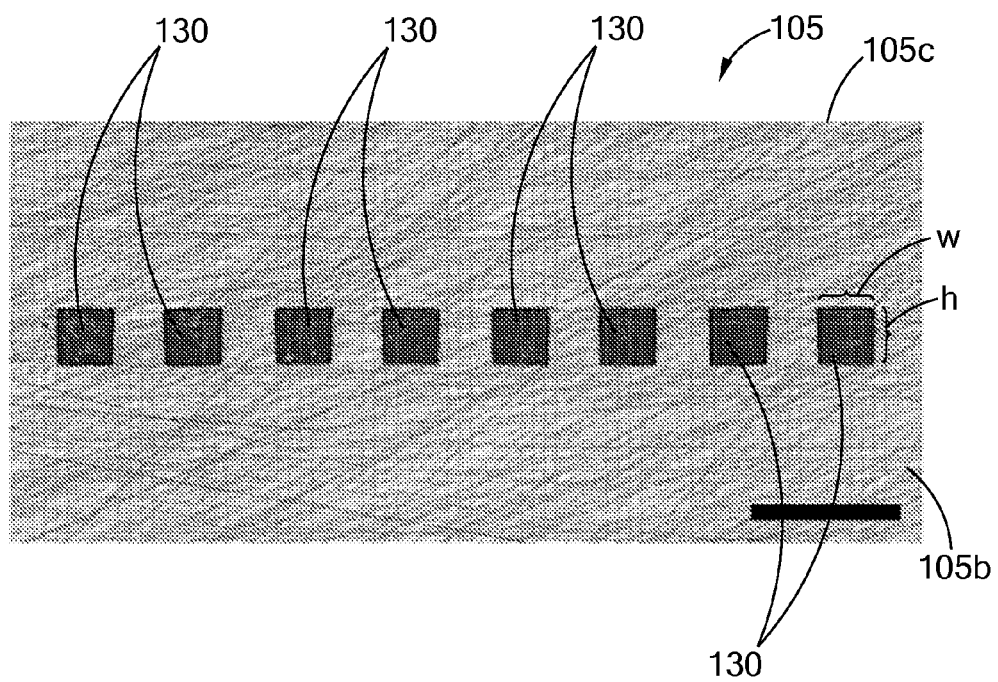

Referring to FIGS. 1 and 2, a first end 105a of the body 105 includes an inlet 125 to the parent microchannel 115a, and a second end 105b of the body 105 includes $2^k$ outlets 130 (see also FIGS. 3a-3b) from the branching microchannels 115k of the final generation. Since in this example m is 2 and k is 6, the number of nozzles or outlets 130 is equal to 64 ($2^6$). Because the multinozzle deposition system 100 is designed for (although not limited to) parallel deposition of highly concentrated and/or high viscosity ink systems, the body 105 is made of a material having a sufficient rigidity to sustain a pressure of about 100 psi (about 690 kPa) or greater in the microchannels 115 without distortion, where distortion is defined as a 5% or greater variance in the height h and/or width w of the channels along a length thereof due to an internally applied pressure.

The number of generations k is unlimited in theory, although practically speaking, fabrication challenges increase as k increases. Accordingly, k typically lies in the range from 2 to 20 or from 2 to 10, and may more likely be in the range from 4 to 8. Since the number of branching microchannels 115 of the $k^{th}$ generation is equal to $2^k$, the first network 110 may include from 8 to 256 outlets 130, according to one embodiment.

The multinozzle deposition system may further include an ink source in fluid communication with the single inlet of the first network, and a substrate that underlies the $m^k$ outlets and is supported by a printing stage. The deposition system may also include a motion controller operably connected to at least one of the body and the printing stage. In the embodiment described below, where the body of the multinozzle deposition system includes a second network of microchannels in addition to the first network of microchannels, the multinozzle deposition system may further include a second ink source in fluid communication with an inlet to the second network.

Figure 7A:
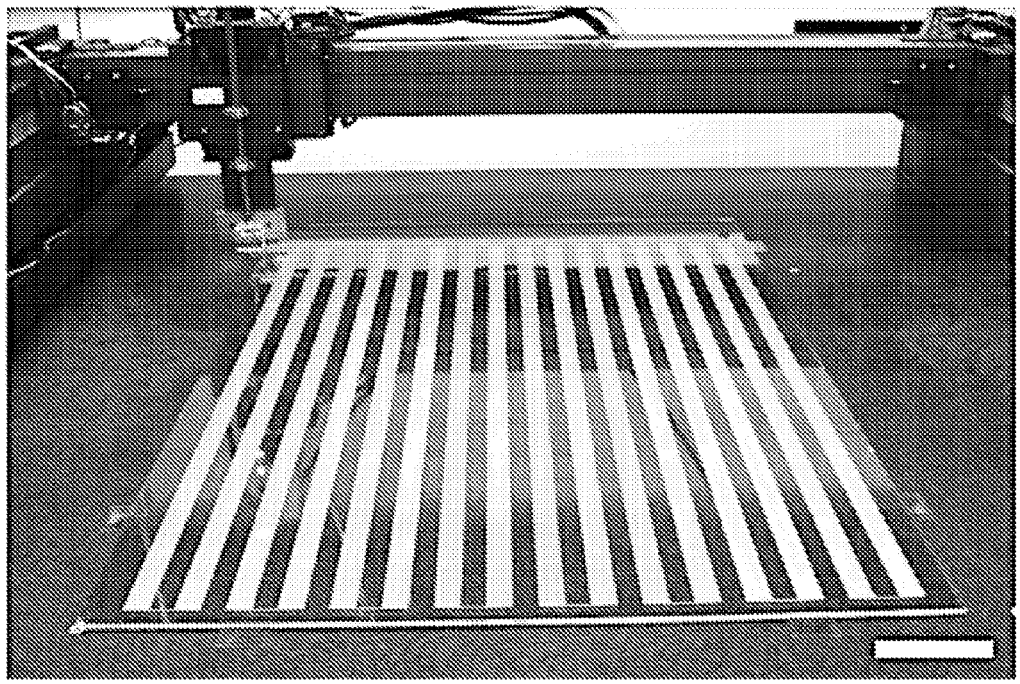
FIG. 7a shows the result of large scale deposition over a 0.8 m² area (scale bar=10 cm)
Figure 7B:
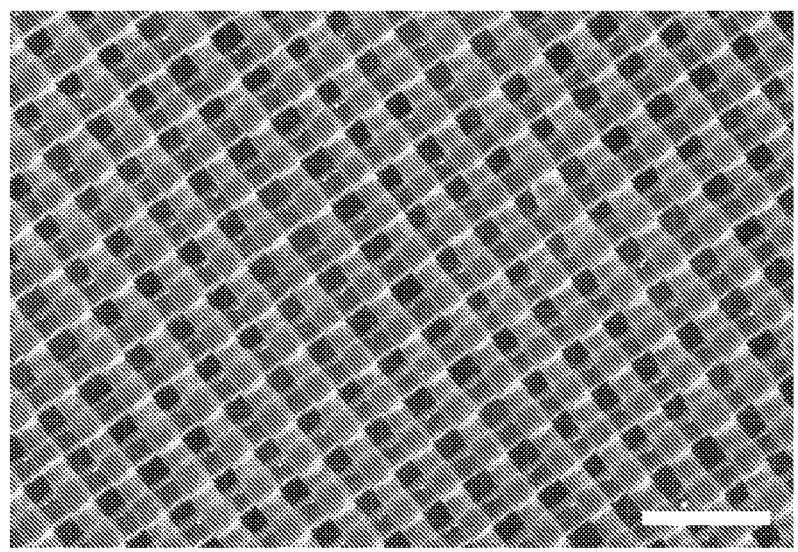
FIG. 7b shows an image of a two-layer structure printed with a 64 nozzle, 400 μm center-to-center spacing printhead (scale bar=1 mm)

The potential patterning area of the multinozzle deposition system is limited only by the deposition stage area, as demonstrated by the patterning of a large glass substrate (0.8 $m^2$ in area) with ink from a 64-nozzle printhead, as illustrated in FIG. 7A. Substrates in excess of one square meter in area may be patterned. In addition, multiple-layer three-dimensional (3D) structures may be quickly patterned over similarly large areas by rotating the printhead by 90° between deposition of successive layers to create log-pile microstructures (FIG. 7B). Unique structures can be printed by altering the initial printhead center-to-center spacing or by on-the-fly rotation angle changes and lateral offset(s) relative to previously deposited layers.

To reduce the applied pressure for material flow during printing, it may be beneficial to follow the bioinspired principle of Murray's Law. To maintain Murray's law, the microchannels of the network may be self-similar where, in each generation, a ratio of a given dimension to the hydrodynamic radius (or width w) of the microchannel is equivalent to a proportionality constant (C). For example, according to a first embodiment, each microchannel may have a length L which is proportional to its hydrodynamic radius (or width w) such that L/w=C, where the length L represents the total length of a microchannel between successive bifurcations. The ratio of L/w may be between 10 and 15, e.g., 12.5, for each generation of the microchannel network. Exemplary microchannel dimensions according to this embodiment are provided in Table 1 below.

TABLE 1

Dimensions of an exemplary microvascular bifurcating network according to the first embodiment

| Generation | $w/w_6$ | w (μm) | L (mm) |
|---|---|---|---|
| 0 | 4.0 | 800 | 10.0 |
| 1 | 3.175 | 635 | 7.94 |
| 2 | 2.520 | 508 | 6.30 |
| 3 | 2.0 | 400 | 5.0 |
| 4 | 1.587 | 317.5 | 3.97 |
| 5 | 1.260 | 252 | 3.15 |
| 6 | 1.0 | 200 | 2.50 |

Figure 3C:
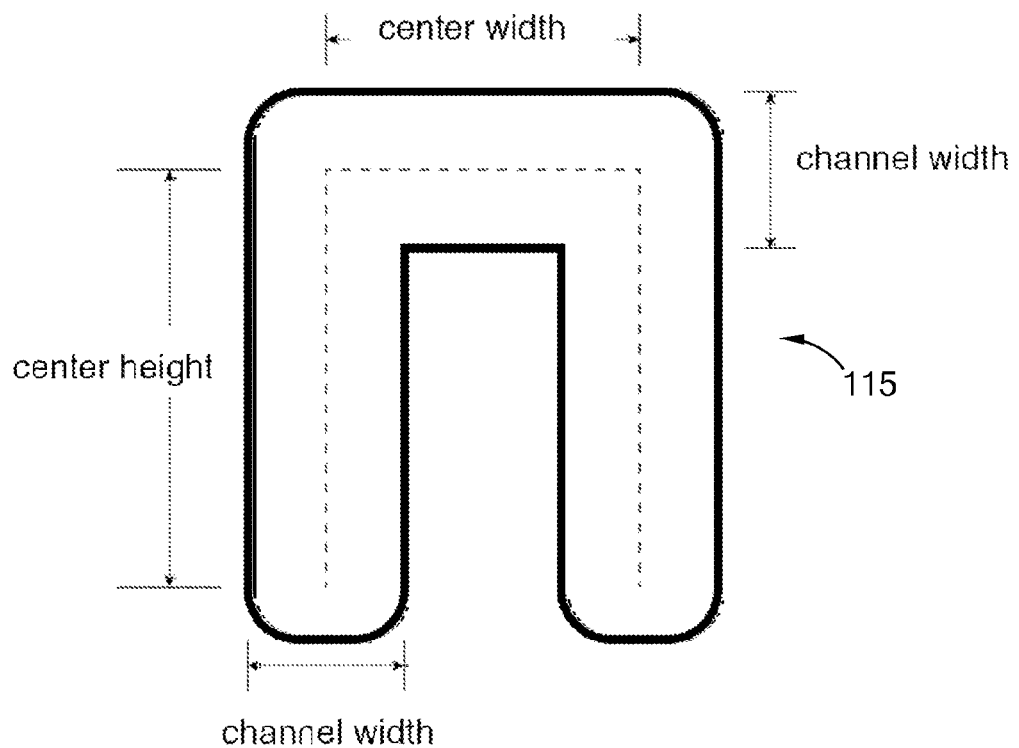
FIG. 3c is a schematic showing how dimensions of the microchannels are defined.

According to a second embodiment, the center height ($h_c$) may be proportional to the channel width (w) such that $h_c/w=C$, where the center height $h_c$ and other channel parameters are defined as shown in FIG. 3c. The ratio of $h_c/w$ may be, for example, greater than 1 and no more than about 20, or no more than about 10. The ratio of $h_c/w$ may also be between about 2 and 4, e.g., 3, for each generation of the microchannel network. It is also envisioned that microchannels from two or more but not all of the generations may be self-similar.

Provided below in Table 2 are typical values for the dimensions of an exemplary bifurcating network consistent with the second embodiment. The output channel width is 200 μm (0.2 mm). The channel widths (w) of the preceding generations are made larger (relative to the example of Table 1) to reduce the pressure required to extrude ink through the network. Generations 1 through 5 are made self-similar, where the center height ($h_c$) is three times the channel width (w), while in the final generation, the center height is made 15 times longer than its width.

TABLE 2

Dimensions of an exemplary microvascular bifurcating network according to the second embodiment

| Generation | $w/w_6$ | Channel width (w) (mm) | Center Height ($h_c$) (mm) | Center Width ($w_c$) (mm) | Length (L) (mm) |
|---|---|---|---|---|---|
| 0 | 8 | 1.6 | 4.8 | — | 4.8 |
| 1 | 6 | 1.2 | 3.6 | 12.8 | 20 |
| 2 | 5 | 1 | 3 | 6.4 | 12.4 |
| 3 | 4 | 0.8 | 2.4 | 3.2 | 8 |
| 4 | 3 | 0.6 | 1.8 | 1.6 | 5.2 |
| 5 | 2.5 | 0.5 | 1.5 | 0.8 | 3.8 |
| 6 | 1 | 0.2 | 3 | 0.4 | 6.4 |

In general, the length L of each microchannel may range from about 1 mm to about 100 mm, the center height $h_c$ may range from about 0.05 mm to about 50 mm, the center width $w_c$ may range from about 0.05 mm to about 50 mm, and the channel width w may range from about 10 microns to about 2,000 microns (2 mm). More particularly, the length L may range from about 1 mm to about 20 mm, the center height $h_c$ may range from about 1 mm to about 5 mm, the center width $w_c$ may range from about 0.5 mm to about 12 mm, and the channel width w may range from about 100 microns to about 1,000 microns. Each of the branching microchannels 115k of the $k^{th}$ generation may have a width w of about 500 microns or less, or about 300 microns or less. The microchannels shown in FIGS. 3a and 3b have a square transverse cross-section where w=h, although other cross-sectional shapes are possible, including circular, rectangular, triangular, diamond-like, and others. Deviation from the self-similar cross-sectional dimensions is possible as long as the furcations are symmetric in dimensions and fabricated within tolerances that allow symmetric fluid flow through all m microchannels in a generation.

It may be beneficial to produce a network that does not conform to Murray's Law. In biological (microvascular) systems, wider vessels lead to a reduced pressure drop and increase in flow rate, whereas narrow vessels lead to a reduction in the total volume of fluid and an increase in the diffusion of nutrients. In the printing applications of interest here, reducing the total volume of fluid and diffusion are of little importance, whereas the benefits of wider channels may be advantageous. Accordingly, a network having channels as wide as geometrically possible may allow for increased flow (printing) rates.

Figure 3D:
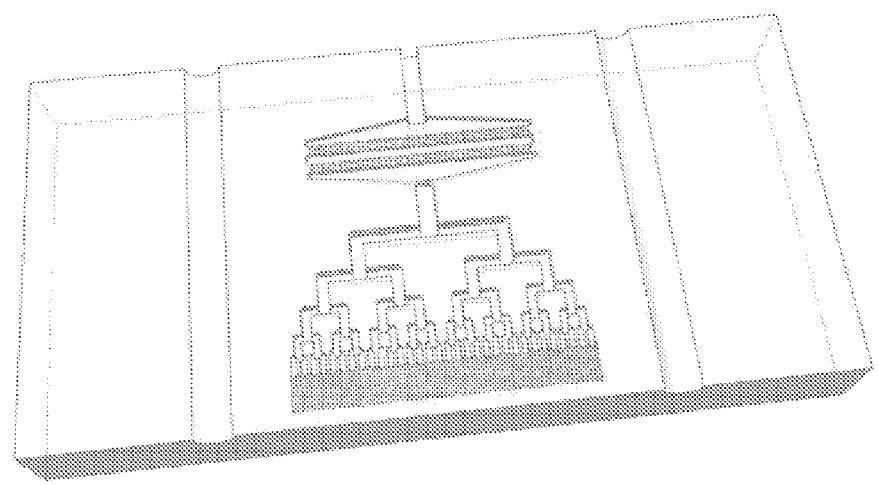
FIG. 3d is a schematic of a block of material that includes a wide channel network and prefilter.

Referring to FIG. 3d, an exemplary wide channel network that does not conform to Murray's Law is shown formed in a first block of material (prior to assembly and bonding to form a multichannel deposition system, as discussed below). Such a geometry may lead to increased flow (printing) rates. The two-layer printed structure shown in FIG. 3f was produced by a multichannel deposition system having such a wide channel network geometry at a print speed of 40 mm/s and a print pressure of 750 psi (about 5.2 MPa). (The width of the image is 35 mm.)

Figure 3E:
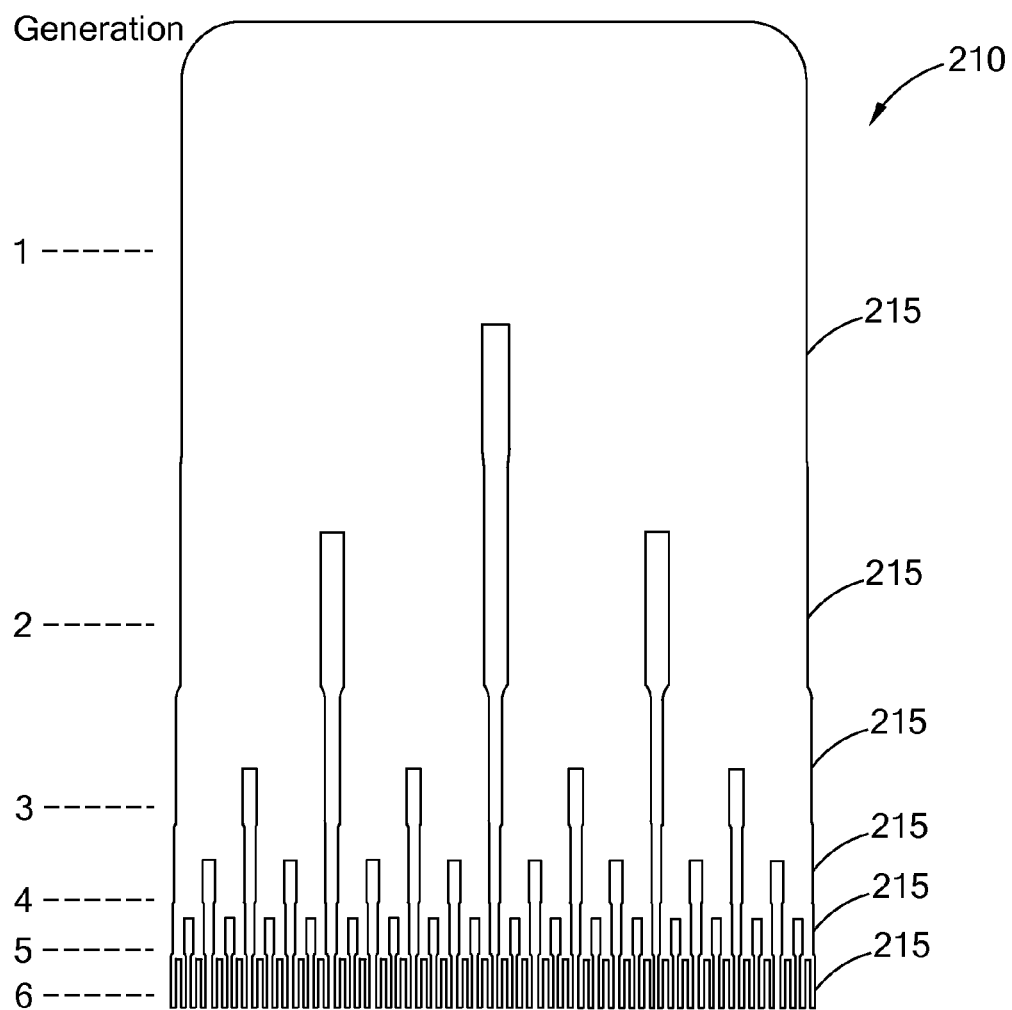
FIG. 3e shows an exemplary geometry for an ultrawide microchannel network.
Figure 3F:
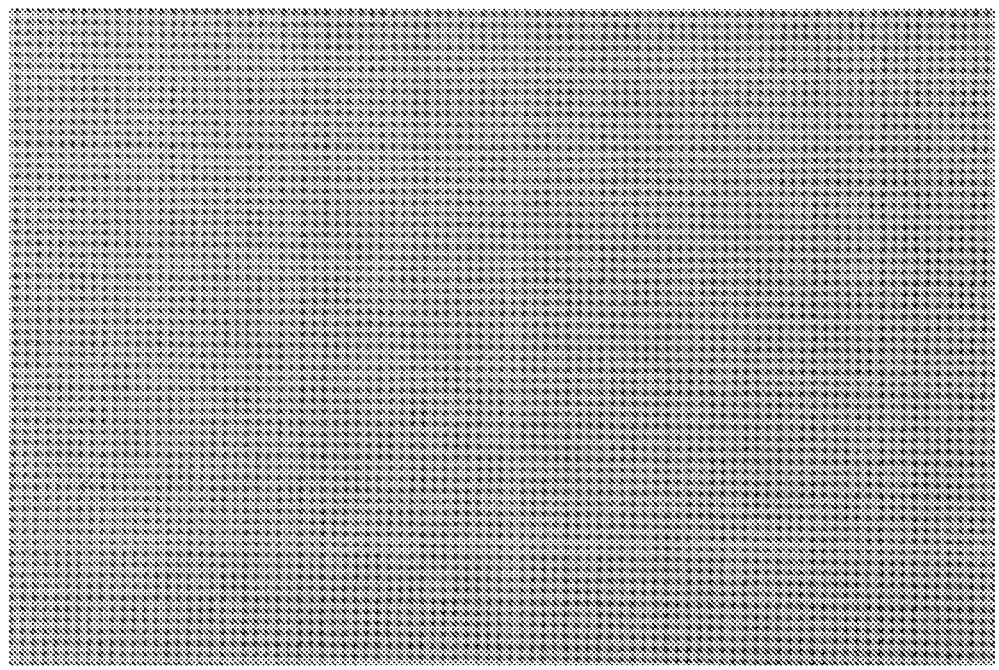
FIG. 3f is an image of a two-layer structure printed with a wide channel network using an applied pressure of 750 psi (about 5 MPa) (to supply the ink) and a printing speed of 40 mm/s (image width is 35 mm)

Table 3 below provides dimensions of an exemplary network 210 including ultrawide microchannels 215, as shown for example in FIG. 3e. In previous examples, each generation included a 90° bend; that is, the microchannel included a horizontal component in addition to a vertical component. According to this embodiment, there is an almost negligible horizontal component. The $0^{th}$ generation may be nearly as wide as the entire final generation of branching microchannels 215k. A "dividing wall" splits the microchannel 215 of generation 1 into two microchannels 215. Then subsequent dividing walls divide each microchannel 215 roughly in half each time.

TABLE 3

Dimensions of an exemplary microvascular bifurcating network including ultrawide microchannels

| Generation | Width (mm) | Depth (mm) | Length/Leg (mm) |
|---|---|---|---|
| 0 | 25.00 | 2.40 | 10 |
| 1 | 12.00 | 2.10 | 8.0 |
| 2 | 6.00 | 1.80 | 7.0 |
| 3 | 2.70 | 1.50 | 6.0 |
| 4 | 1.20 | 1.20 | 4.0 |
| 5 | 0.50 | 0.50 | 3.0 |
| 6 | 0.20 | 0.20 | 2.0 |

As indicated above, the body of the multinozzle deposition system is made of a material that can sustain the pressures in the microchannels without cracking or deforming. Advantageously, the material can withstand a pressure of at least about 300 psi (about 2 MPa), e.g., between about 300 psi (about 2 MPa) and about 800 psi (about 5.5 MPa), or between about 400 psi (about 2.8 MPa) and about 600 psi (about 4.1 MPa). The material may be a polymer, such as poly(methyl methacrylate) (PMMA), which has an elastic modulus (stiffness) of between about 1800 MPa and 3100 MPa. Other suitable materials include other polymers (e.g., poly(vinyl chloride), polycarbonate, polystyrene, teflon) or another material having a suitable stiffness (i.e., a resistance to distortion as described previously) and which is chemically compatible with the ink flowing through the embedded microchannel network. For example, metals or alloys such as aluminum or brass may be employed. Advantageously, the material used for the body of multinozzle deposition system is also readily machined.

Figure 4A:
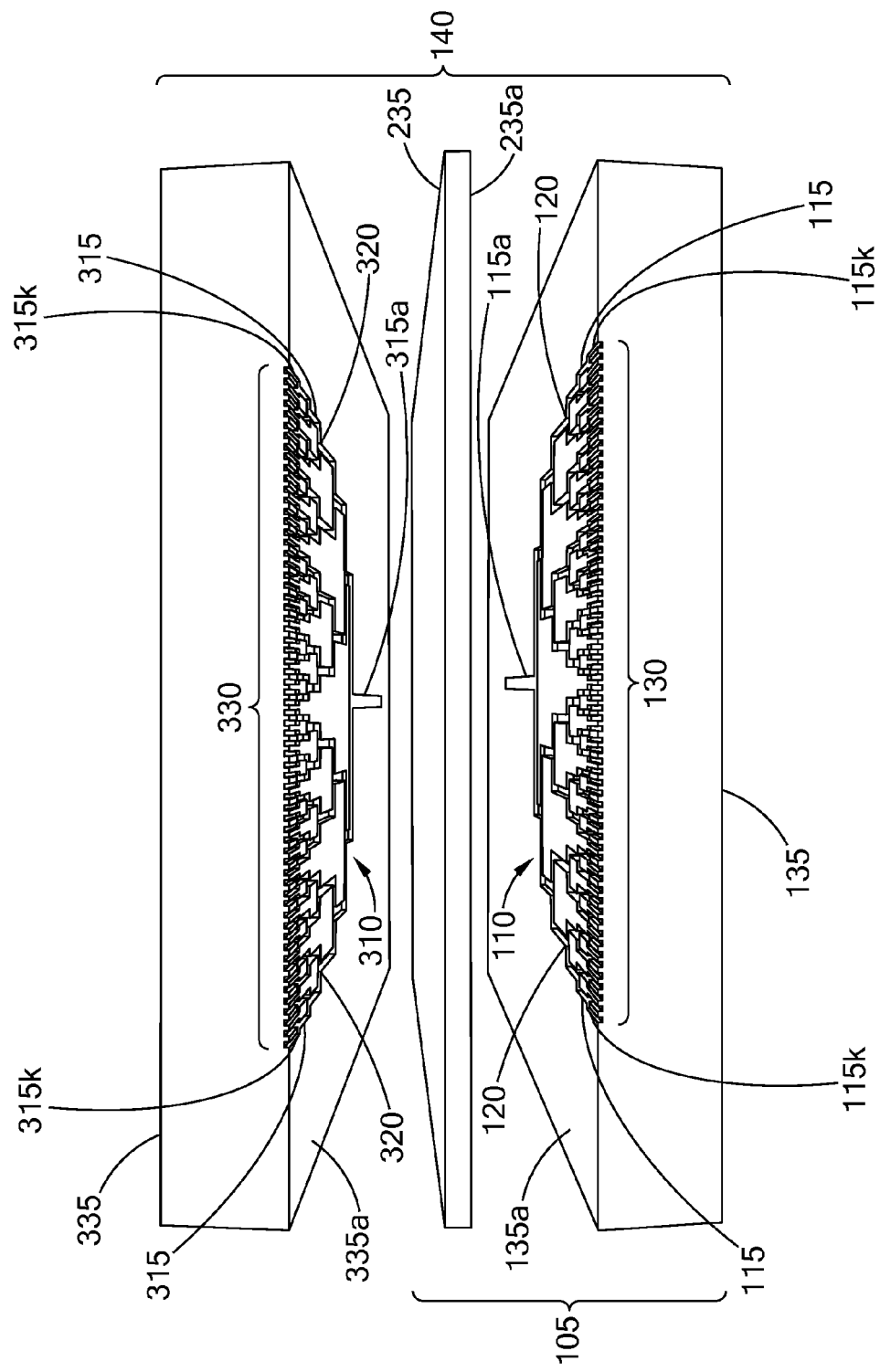
FIG. 4a is a schematic of an exemplary multinozzle deposition system prior to assembly and bonding to include two embedded networks of microchannels that enables multimaterial deposition.
Figure 4B:
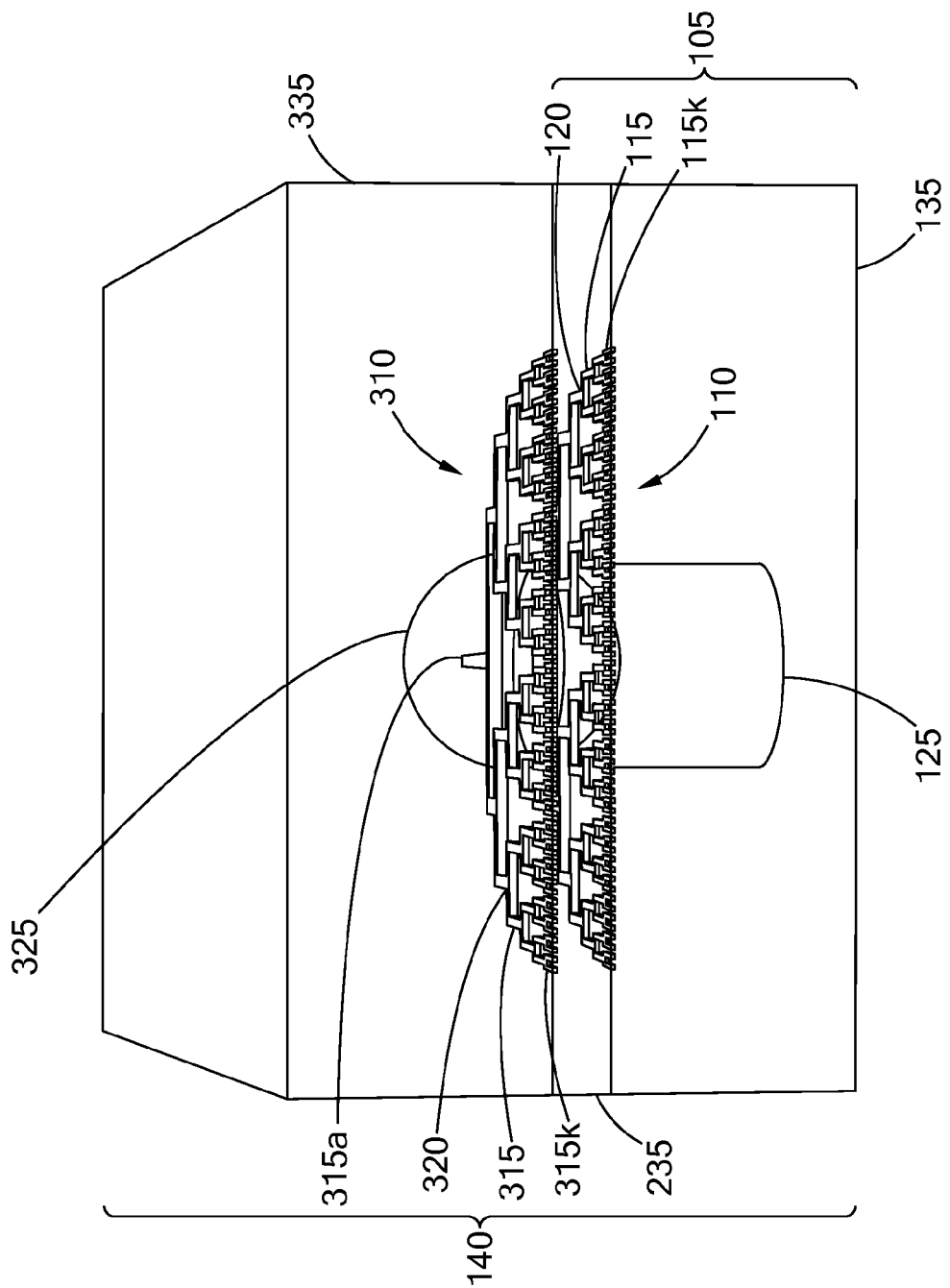
FIG. 4b is a schematic of the multinozzle deposition system of FIG. 4a after assembly and bonding, where the inlet to one of the networks comes from the backside of the system and the inlet to the other network comes from the bottom of the system.

Referring now to FIG. 4a-4b, the multinozzle deposition system may further include a second network 310 of microchannels 315 embedded in an expanded monolithic body 140, the fabrication of which is described below. The second network 310 extends from a parent microchannel 315a through a series of bifurcations 320 to a plurality of branching microchannels 315, where the series consists of k generations and the final ($k^{th}$) generation has a total of $2^k$ branches, where k is an integer greater than or equal to 1. A first end (back side in this example) of the body 140 includes a single inlet 325 to the parent microchannel 315a, and a second end (front side) of the body 140 includes $2^k$ outlets 330 from the branching microchannels 315k of the final generation. Since in this example k is 6, the number of nozzles or outlets 330 is equal to 64. As indicated previously, the furcation number m, which in this case is equal to 2, may be 3 or greater provided each channel has equal resistance to flow.

Figure 4C:
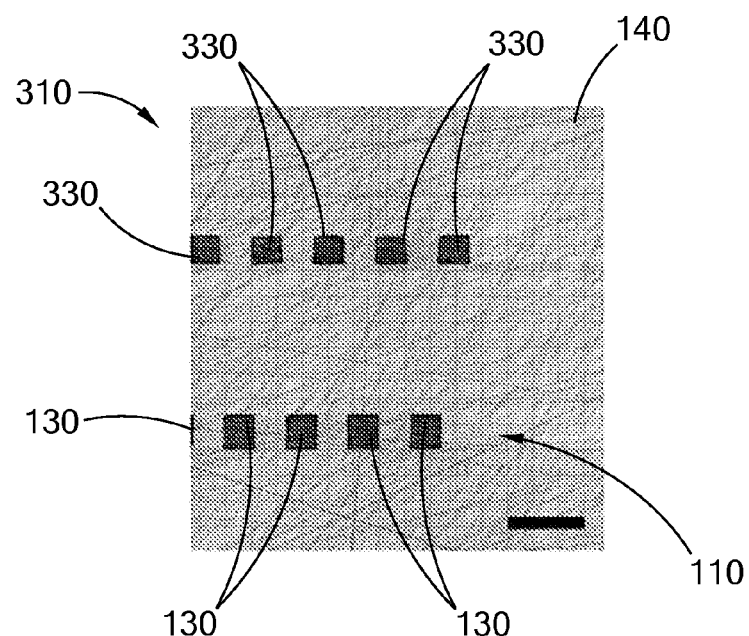
FIG. 4c is an optical micrograph showing a sideview of the system of FIG. 4b where several outlets from each network are visible, and where the outlets of the top network are horizontally offset by 200 microns relative to the bottom network (scale bar is 500 microns)
Figure 4D:
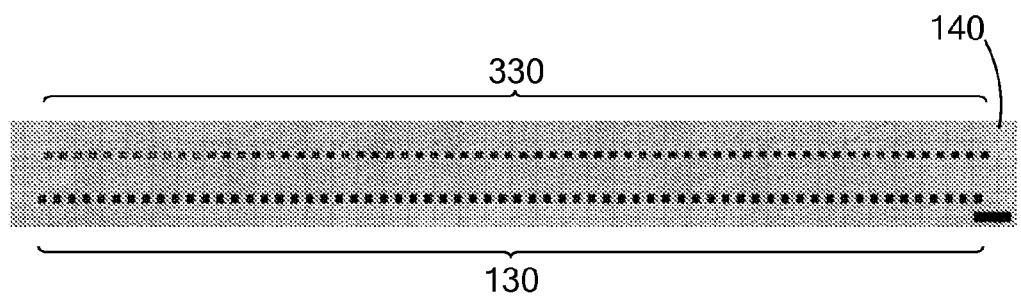
FIG. 4d is an optical micrograph showing all of the outlets (128) from the system of FIG. 4b (scale bar is 1 mm)

Referring to FIG. 4c, the second network 310 of microchannels 315 is laterally offset from the first network 110 of microchannels 115 by an amount equal to half the center-to-center spacing between adjacent microchannels of the $k^{th}$ generation (e.g., outlets 130). The figure also shows that the second network 310 of microchannels is spaced apart from the first network 110 of microchannels in the thickness direction of the body.

Figure 5A:
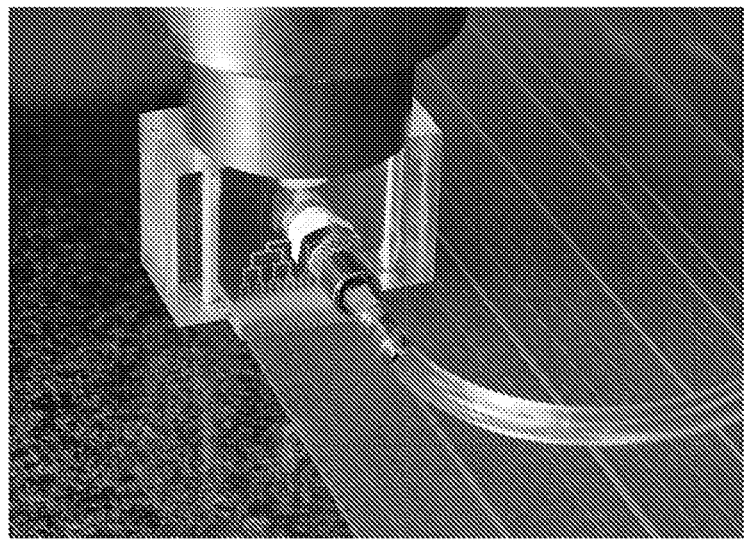
FIG. 5a is a photograph of a co-infiltration array with two embedded networks of microchannels, where a printhead is mounted to a rotation stage and the leading network prints fugitive wax filaments (top input, not visible), while the trailing network deposits a UV-curable epoxy (side input, visible) (scale bar=25 mm)
Figure 5B:
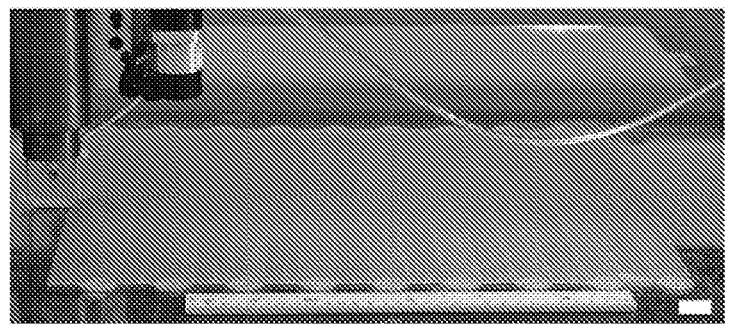
FIG. 5b shows co-infiltration multinozzle printing of an exemplary 0.5×0.5 m² structure (scale bar=25 mm)
Figure 5C:
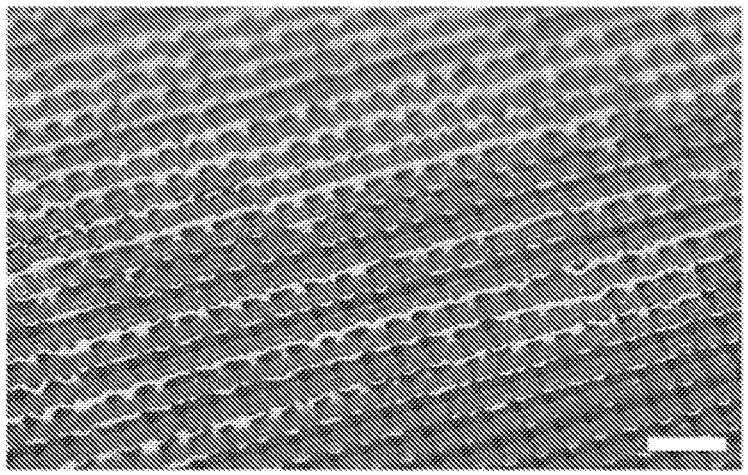
FIG. 5c shows a view of a two-layer co-infiltrated structure with 200 μm spanning wax features and a UV-curable epoxy in the interstitial regions (scale bar=1 mm)

As the first ink is deposited onto the substrate the open volume between the printed features is selectively infiltrated by another, independently fed ink deposited from a second set of nozzles, offset laterally, as illustrated in FIGS. 5a-5c. The equal bifurcation of flow in these networks is independent of the physical characteristics of the ink used and allows simultaneous patterning of inks with vastly different properties. For example, structures may be printed to form a lattice structure including a predetermined embedded porosity, where the physical lattice structure is constructed from a curable liquid (e.g., a UV-curable liquid polyurethane) and the embedded porosity is determined by a gelled fugitive ink (e.g., a microcrystalline wax ink as described below) that is removed after printing. Other suitable systems for the physical structure include materials that may be air cured or dried, thermally cured, light cured, and/or two-part systems (e.g., PDMS, Epicure/Epon, silicone caulk). The gelled ink is flowed through the nozzle array that leads the deposition with respect to the printing motion, while the trailing nozzle array deposits the curable liquid within the grooves created by the ink features. The curable liquid is cured and the fugitive high viscosity ink is removed to create a defined porosity microstructure whose shape and porosity can be easily controlled by the microvascular printhead design. Alternatively, both inks may be curable liquids that remain after printing to form a substantially dense structure as described in the example below. In the case of deposition areas in excess of 0.5 m² and greater, infiltration of such structures with a second ink after deposition of a first ink is prohibitively long (>6 hr). Hence, the parallel deposition and infiltration process described here and shown in FIGS. 5a-5c can reduce manufacturing times by over 90% relative to the serial process of multinozzle deposition followed by separate infiltration.

Several inks may be suitable for deposition using these multinozzle deposition systems, including fluids, resins, hydrogels, cell-laden hydrogels, and viscoelastic inks composed of ceramic, metallic, semiconductor, or polymer particles, waxes, metallo-organic precursors, photopolymerizable species, and so forth. The ink viscosities can span the range from 0.001 to 10,000 Pa·s.

Figure 6A:
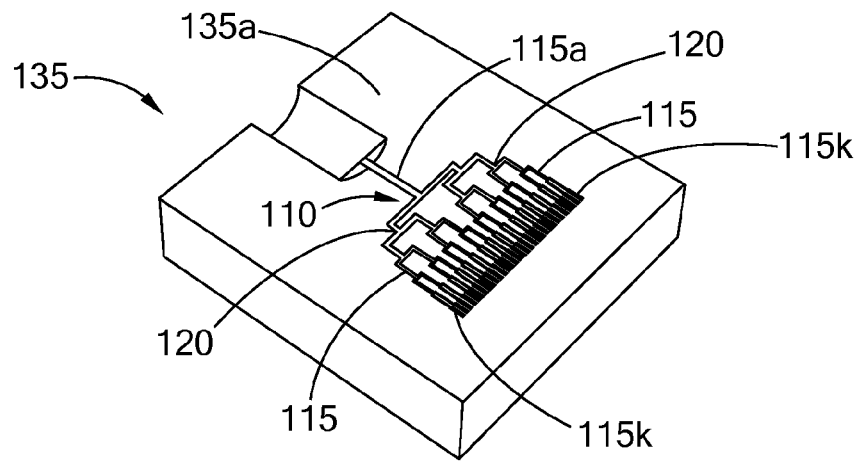
FIGS. 6a-6c show a series of exemplary steps in fabricating a multinozzle deposition system, including CNC milling to form a hierarchical microvascular network of microchannels in an acrylic block (FIG. 6a), which is then solvent welded to a pristine acrylic block (FIG. 6b) to form an embedded microvascular structure (FIG. 6c) in a monolithic acrylic body.
Figure 6B:
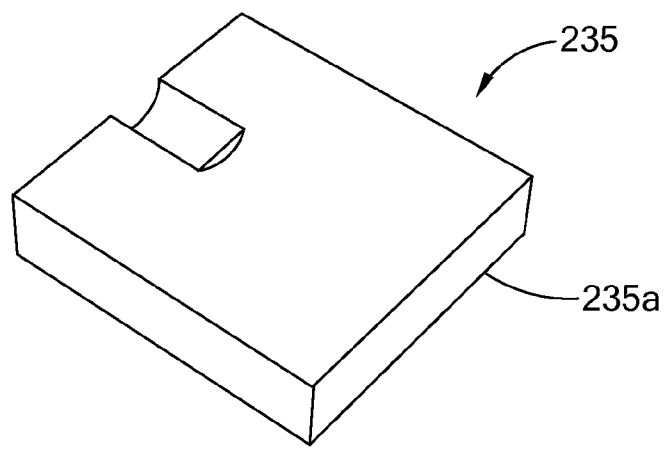
Figure 6C:
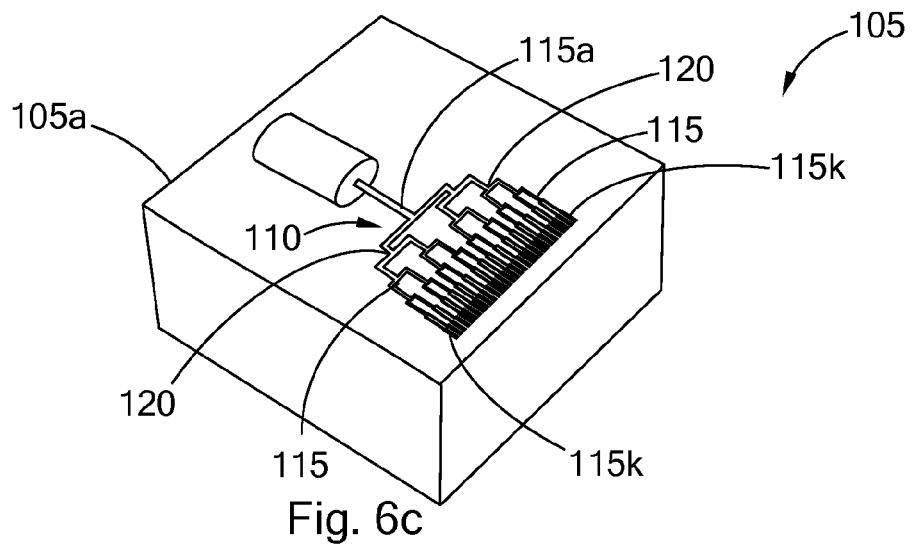
Figure 6D:
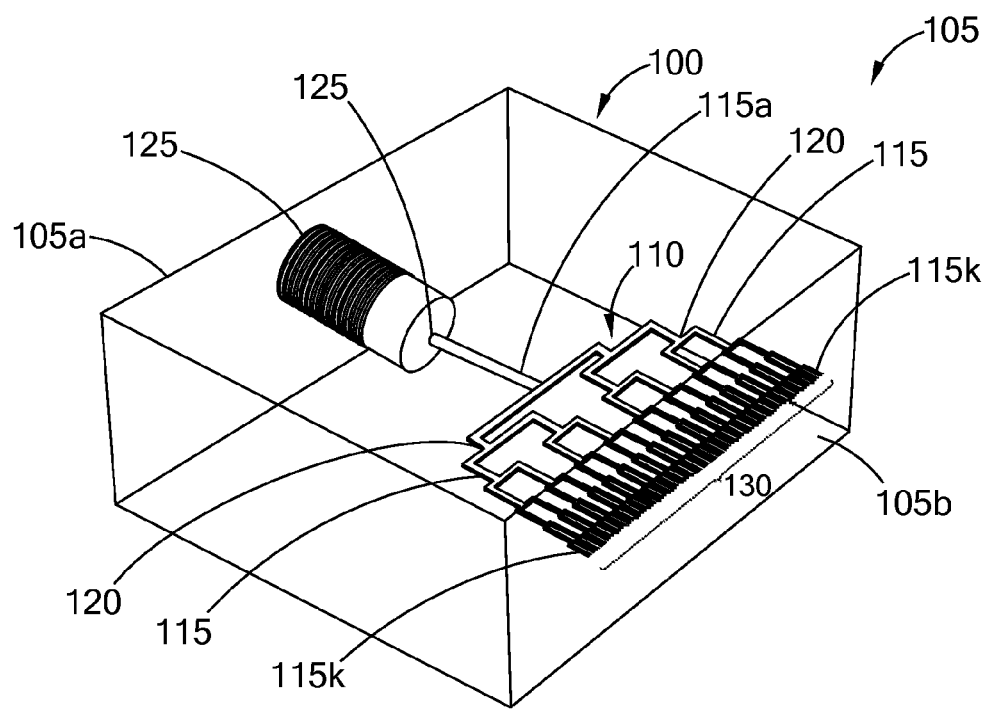
FIG. 6d shows the final multinozzle deposition system formed from the steps of FIGS. 6a-6c after the inlet is threaded and the end of the device is milled and polished to expose the multinozzle array.
Figure 6E:
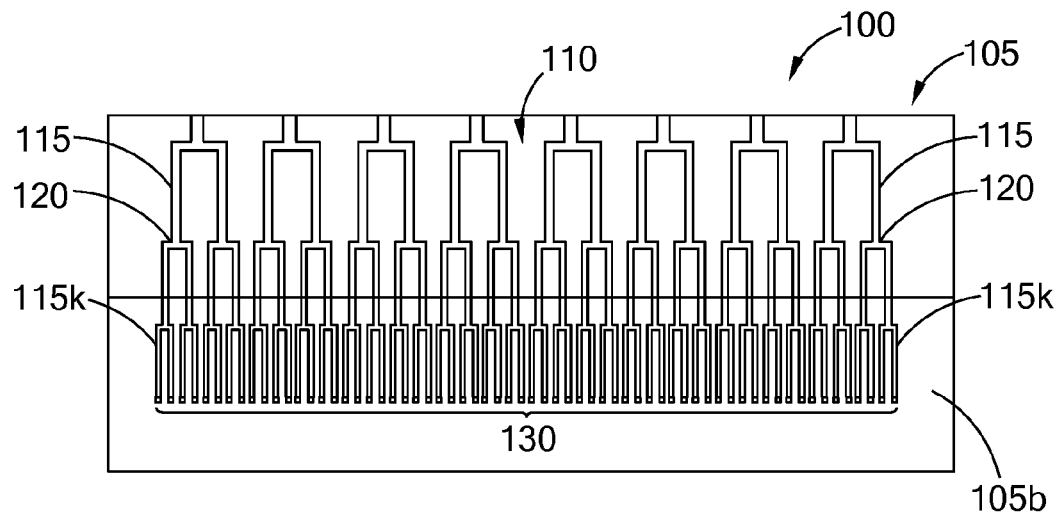
FIG. 6e shows a view of the 64 uniform and parallel outlets to the microchannel network of the deposition system of FIG. 6d.

A method of fabricating an exemplary multinozzle deposition system is set forth in reference to FIGS. 6a-6e. The method includes providing a first block 135 of material and selectively removing some of the material from a surface 135a of the first block 135 to form a network 110 of microchannels 115 therein, as shown in FIG. 6a. The network 110 extends laterally across the first block 135 and each microchannel 115 comprises a depth smaller than a thickness of the first block 135. A fugitive material may be deposited into the microchannels 115, and a second block of material 235 (FIG. 6b and FIG. 4a) is provided for bonding. The surface 135a of the first block 135 and a surface 235a of the second block 235 are bonded together (e.g., with solvent) to form a monolithic body 105 having the network 110 of microchannels 115 embedded therein (FIG. 6c). A single inlet 125 to the network 110 of microchannels 115 is defined at a first end 105a of the monolithic body 105 and a plurality of outlets 130 from the network 110 are defined at a second end 105b of the monolithic body 105 (FIG. 6d). Finally, the optional fugitive material may be removed from the microchannels 115, thereby fabricating a multinozzle deposition system 100 (FIGS. 6d and 6e).

Prior to removing some of the material from the surface 135a to form the network 110 of microchannels 115, the surface 135a of the first block 135 may be flattened to achieve a substantially planar surface 135a. Next, material may be selectively removed from the surface 135a of the first block 135 by milling using an end mill of an appropriate shape and size to create microchannels 115 of the desired width, length and cross-sectional shape. Alternatively, the network 110 of microchannels 115 may be formed by embossing, molding, or etching. Once formed, the network 110 may extend laterally across the first block 135 from a parent microchannel 115a to a plurality of branching microchannels 115 via a series of bifurcations 120, where the network 110 consists of k generations and the $k^{th}$ generation of the network consists of $2^k$ branching microchannels, where k is an integer equal to 1 or greater. The second end 105b of the monolithic body 105 may be polished to create the outlets 130 from the branching microchannels 115k, where each outlet is connected to one of the $2^k$ branching microchannels 115k of the $k^{th}$ generation.

The surfaces of the first block and the second block may be bonded together by a bonding process that entails applying a solvent to the surface of the first block and bringing the surfaces into contact. A pressure may be applied to the assembly during bonding. For example, the applied pressure may range from about 1 psi to about 10,000 psi (about 7 kPa to about 70 MPa). Relatively low pressures, such as from about 1 psi to about 5 psi (about 7 kPa to about 35 kPa), may be sufficient to promote bonding.

The solvent may be acetonitrile, acetone, dichloromethane, or other solvents that mobilize surface polymer chains for bonding. Alternatively, a bonding agent other than a solvent may be used, such as photocurable polymer liquids or thermosetting adhesives. The surfaces may also be bonded without a bonding agent, such as with ultrasonic welding. When a solvent is not used for bonding, it may not be necessary to deposit a fugitive material into the microchannels prior to bonding, as the primary purpose of the fugitive material is to prevent solvent migration into the microchannels during bonding. When a fugitive material is employed, it may be removed from the microchannels after bonding by heating the monolithic body at a temperature of about 30° C. or higher, which allows the fugitive material to liquefy and be drained out of the body.

Referring again to FIGS. 4a-4d, the method may further include providing a third block 335 of material and selectively removing material from a surface 335a of the third block 335 to form a network 310 of microchannels 315 therein, where the network 310 extends laterally across the third block 335 and each microchannel 315 has a depth smaller than a thickness of the third block 335. A fugitive material may be deposited into the microchannels 315 of the third block 335 in preparation for bonding the surface 335a of the third block 335 to a surface 105c of the monolithic body 105 that contains the first network. A solvent bonding technique may be employed, which entails applying a solvent (e.g., acetonitrile) to the surface 335a of the third block 335 and then pressing the surface 335a of the third block 335 and the surface 105c of the monolithic body 105 together to form a bond. Alternatively, another bonding agent may be used as indicated above, and it is also envisioned that the bonding agent or solvent may be applied to the surface of the monolithic body in addition to or instead of the surface of the first block. The result is an expanded monolithic body 140 that includes both the first network 110 of microchannels 115 and the network 310 of microchannels 315 of the third block 335 embedded therein.

All of the procedures described above to process the first block and create the network of microchannels therein, as well as the inlet and the outlets, are also applicable to the processing of the third block. As is the case with the first block, the network of microchannels in the third block may extend laterally across the third block from a parent microchannel to a plurality of branching microchannels via a series of furcations, where the network consists of k generations of furcation number m and the $k^{th}$ generation of the network consists of $2^k$ branching microchannels, where k is an integer equal to 1 or greater and m is an integer equal to 2 or greater.

Figure 6F:
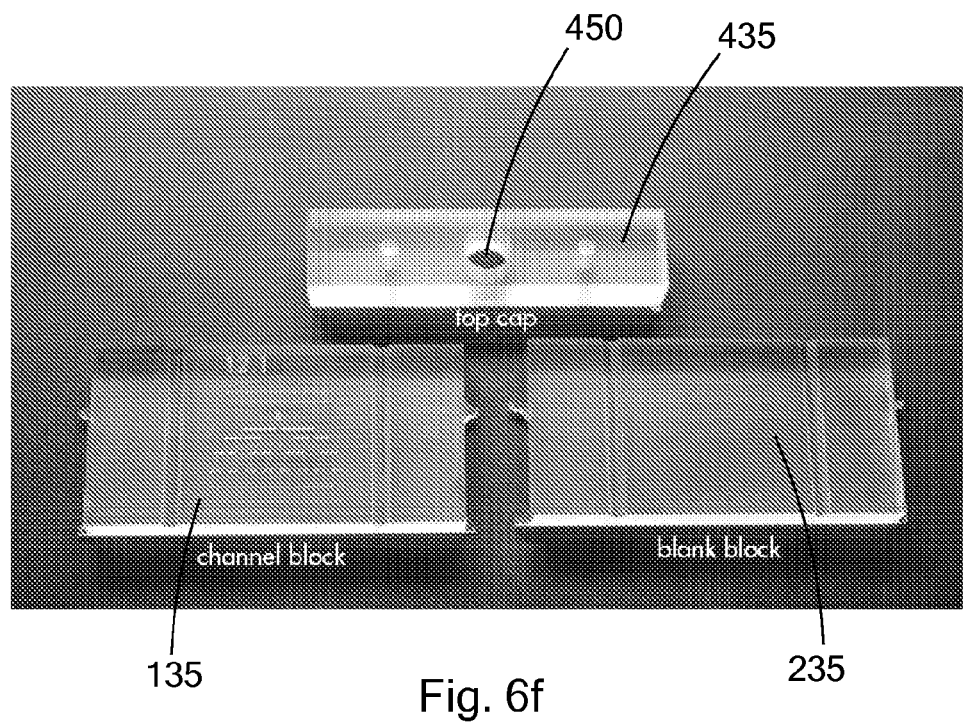
FIGS. 6f and 6g show a channel block ("first block"), blank block ("second block") and a top cap ("fourth block") before (f) and after (g) bonding.
Figure 6G:
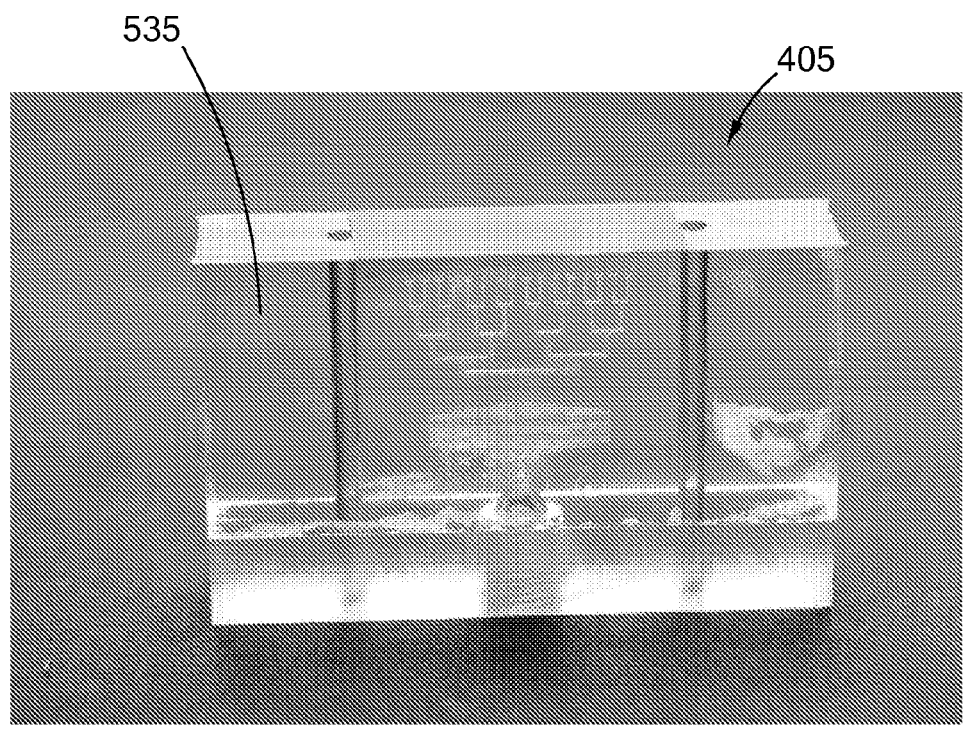

Referring now to FIGS. 6f and 6g, a fourth block 435, which may be referred to as a "top cap," may be used in addition to the first and second blocks 135, 235 to form a "capped" monolithic body that serves as the multinozzle deposition system. The first and second blocks 135, 235 may first be bonded to each other to form a bottom block 535, and then the fourth block or top cap 435 may in turn be bonded to the bottom block 535, thus forming the capped monolithic body 405 shown in FIG. 6g. Prior to bonding, the fourth block 435 may be drilled and tapped to form a threaded hole 450 passing therethrough, and then the threaded hole 450 may be aligned with the inlet 125 to the parent microchannel 115a. Solvent bonding may be particularly advantageous for the bonding, although other bonding techniques may also be used. After bonding the fourth block 435 to the bottom block 535 (which is formed by bonding the first and second blocks 135, 235 together), an ink source can be connected to the threaded hole 450 to permit ink to flow into the parent microchannel 115a and through the network 110 of microchannels 115 for printing.

In the preceding description, the fourth block (top cap) 435 was used in conjunction with the first and second blocks 135, 235 to form the capped monolithic body 405 shown in FIG. 6g; however, the fourth block 435 may also be used along with the expanded monolithic body 140 formed by bonding first, second and third blocks 135, 235, 335 together (as illustrated in FIGS. 4a-4b) in order to form a capped expanded monolithic body. As in the above example, a bonding technique such as solvent bonding may be used to attach the fourth block 435 to the expanded monolithic body 140.

Without the use of the fourth block 435, the monolithic body 105 itself may be drilled and tapped to form the threaded hole 150 for connection to an ink source, as described in Example 1 below. However, when the threaded hole 150 is included directly in the monolithic body 105, problems may occur during hook-up of the ink source and/or printing at high pressures, such as debonding of the first and second blocks 135, 235. Accordingly, use of the fourth block 435 may be advantageous.

It may also be beneficial to modify the inlet 125 to the parent microchannel 115a to reduce the pressure drop from the threaded hole 150 to the inlet 125. For example, referring to FIG. 6h, the inlet 625 may be modified to have an increasing transverse cross-section in a direction away from the microchannels 115, such that the inlet 625 radially expands from the parent microchannel 115a (which may be a few hundred microns in width) to more closely match the diameter of the threaded hole 450 (which may be about 10 mm in diameter). The radially expanded inlet 625 may take the form of a conical passageway 660 formed, for example, by a simple machining operation (e.g., using a chamfer mill). If the threaded hole 450 is part of the fourth block 435 as described above, then the machining to form the conical passageway 660 may take place prior to bonding the fourth block 435 to the bottom block 535.

Figure 6H:
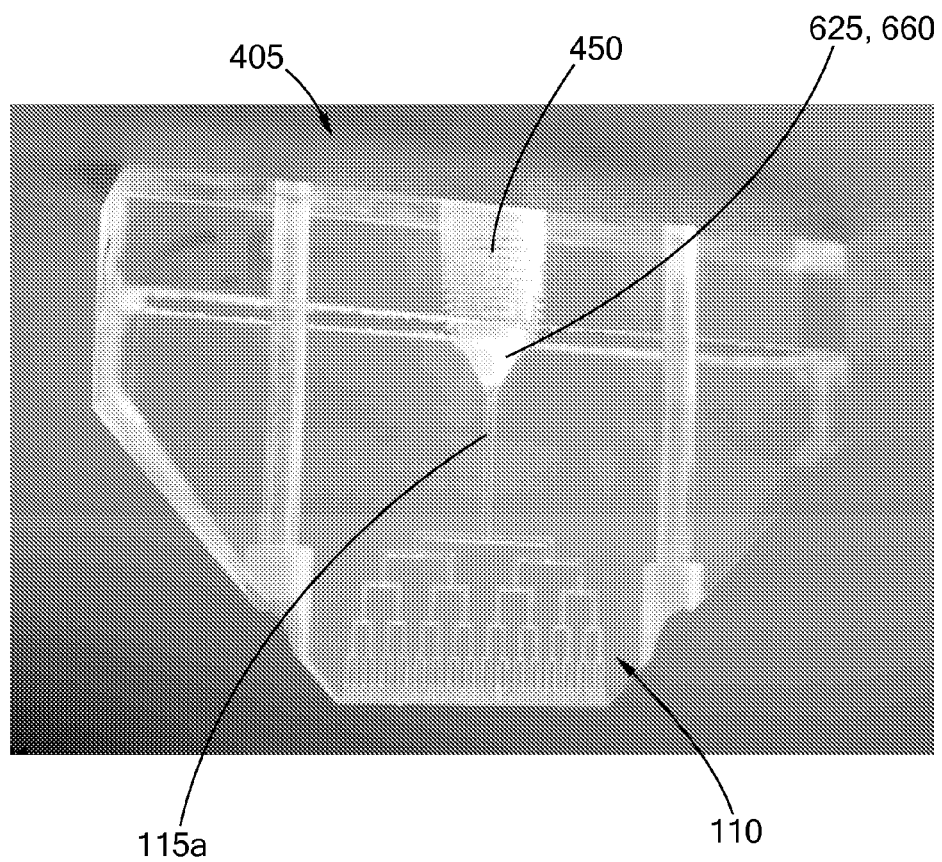
FIG. 6h shows an exemplary multinozzle deposition system that has a tapered final shape.

The multinozzle deposition system formed as described above from at least first and second blocks, and optionally third and/or fourth blocks, may have a cuboidal shape. To promote better printing quality (e.g., to prevent or inhibit adherence of ink to the bottom (outlet) surface of the monolithic body), the deposition system may be formed to have a tapered shape, as described further below and as illustrated in FIG. 6h.

Figure 6I:
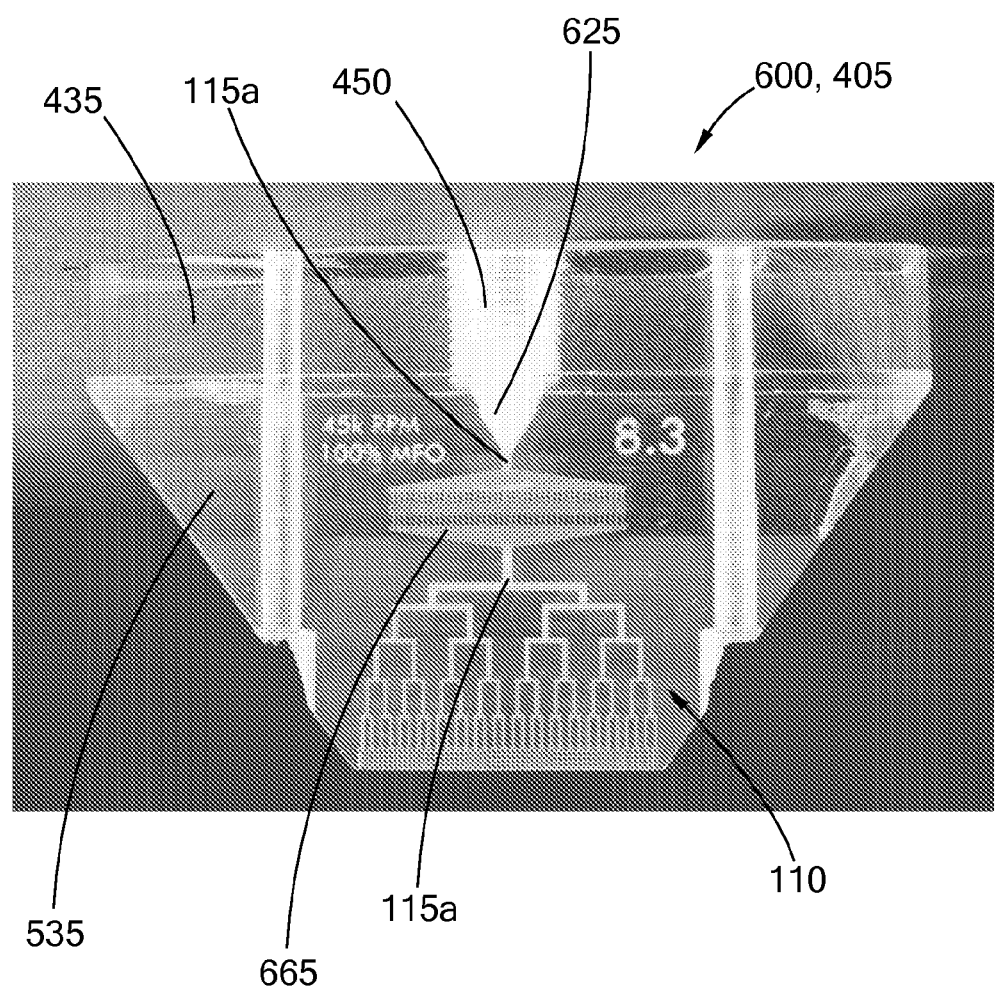
FIG. 6i shows an exemplary multinozzle deposition system that includes a prefilter between the inlet and the first bifurcation in fluid communication with the parent microchannel.
Figure 6J:
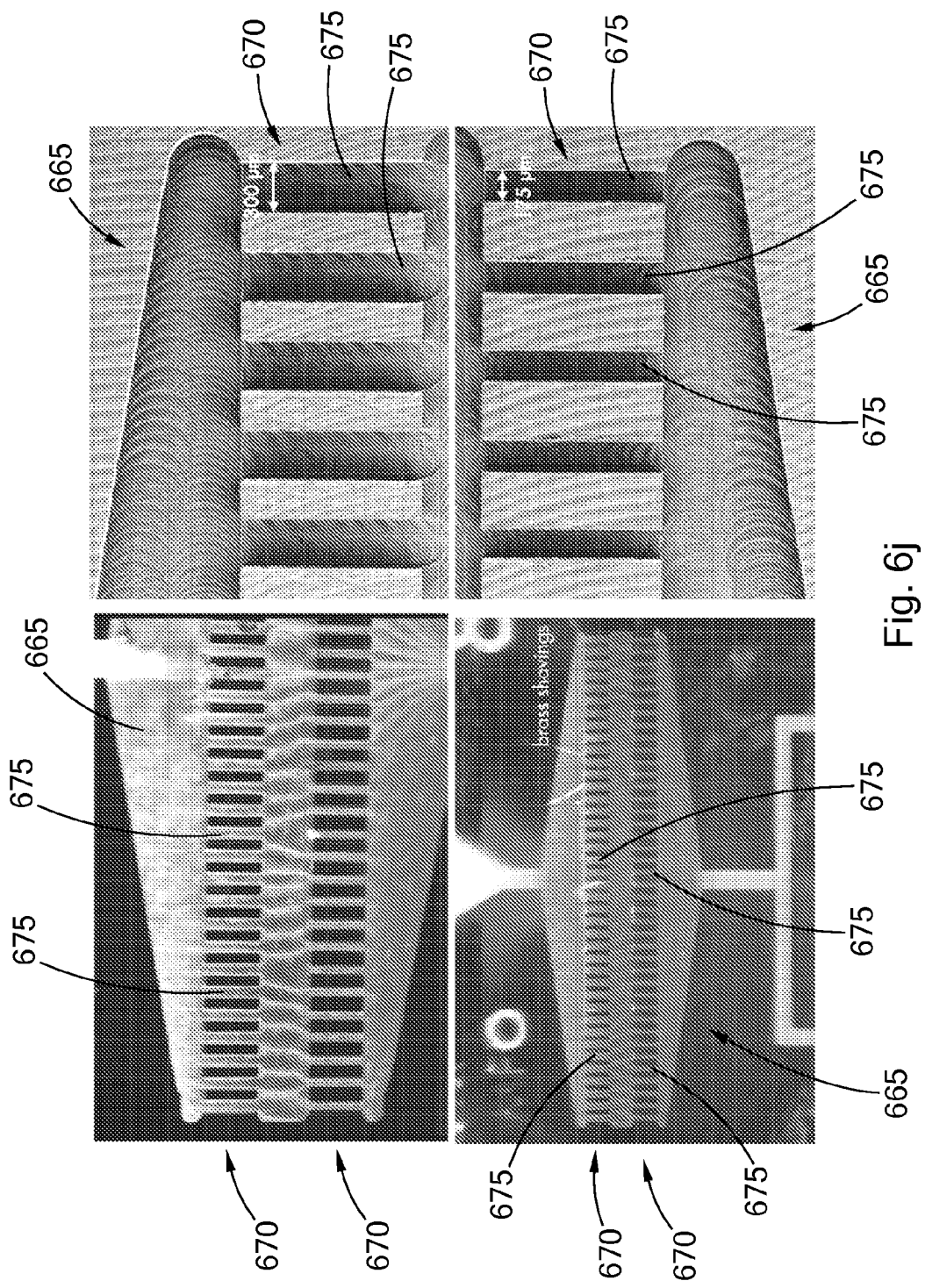
FIG. 6j includes various images showing details of an exemplary prefilter.

Referring to FIG. 6i, the multinozzle deposition system 600 may include a prefilter 665 positioned along the parent microchannel 115a between the inlet 625 and the first bifurcation 120, such that ink that enters the inlet 625 passes through the prefilter 665 before reaching the network 110 of microchannels 115. Referring to FIG. 6j, the prefilter 665 includes a plurality of micropassageways 675 that may help to trap dust or other foreign particulates that could potentially clog the microchannel network 110. For example, the prefilter 665 may include one or two rows 670 of, typically, 40 to 100 parallel micropassageways 675. If the prefilter 665 includes a single row 670, the width and depth of the parallel micropassageways 675 are typically 10% to 25% smaller than the width and depth of the final generation of microchannels 115k. If the prefilter 665 includes two rows 670, the top row 670 (i.e. the row further upstream) may include micropassageways 675 of several hundred microns in width and depth (e.g., about 300-500 μm, such as 400 μm), while the bottom row 670 (further downstream) may including micropassageways 675 having a width and depth of about 80-120 μm (e.g., about 100 μm). The prefilter 665 may be formed in the first block 135 along with the network 110 of microchannels 115 as described above.

A high-throughput printing method may be enabled by utilizing the multinozzle deposition system, as described above according to any of the embodiments, as follows: (a) flowing a first ink into the single inlet of the first network of microchannels such that the first ink passes through the microchannels and through the outlets, and (b) depositing $m^k$ filaments of the first ink simultaneously on the substrate at a printing speed of at least about 1 mm/s. The printing speed may also be at least about 20 mm/s, and, in some cases, at least about 40 mm/s. The multinozzle deposition system may be coupled to a 3-axis motion controlled printing stage supporting the substrate. The first ink may be flowed into the single inlet at a pressure of at least about 2 MPa, or at least about 4 MPa.

The body may further include a second network of microchannels embedded therein as described in detail above, where the $m^k$ outlets of the second network are positioned proximate the substrate. As described above, the second network of microchannels may be laterally offset from the first network of microchannels by an amount equal to half a center-to-center spacing between adjacent microchannels of the $k^{th}$ generation of the first network. Accordingly, the method may further include flowing a second ink into the single inlet to the second parent microchannel (the second ink passing through the second network of microchannels and through the outlets of the second network) and then depositing $m^k$ filaments of the second ink simultaneously on the substrate at a printing speed of at least about 1 mm/s.

The $m^k$ filaments of the second ink may be deposited in interstices defined by the deposition of the $m^k$ filaments of the first ink on the substrate. In addition, the deposition of the $m^k$ filaments of the second ink may occur simultaneously with the deposition of the $m^k$ filaments of the first ink. Like the first ink, the second ink may be flowed into the single inlet to the second parent microchannel at a pressure of at least about 2 MPa, or at least about 4 MPa. The second ink may be different from the first ink, or in some cases, the first and second inks may be the same. The method may further include forming a substantially fully dense structure from the $m^k$ filaments of the first ink and the $m^k$ filaments of the second ink on the substrate.

Nearly a century ago, Murray calculated the optimal radii of branching microvascular vessels based on the minimum power requirement for the metabolic cost of blood and the viscous losses of fluid transport obeying Poiseuille's Law. He observed that the system is optimum when the cube of the parent branch radius ($r_0$) is equal to the sum of the cube of the child branch radii ($r_1$ and $r_2$):

$$r_0^3 = r_1^3 r_2^3 \tag{1}$$

The derivation can be generalized to yield:

$$r_0^3 = \sum_i^n r_i^3 \tag{2}$$

where $r_i$ are the radii of the n child (branching) branches.
When applied to the specific case of symmetrical bifurcated branching, the result is:

$$r_k = 2^{-k/3} r_0 \tag{3}$$

where $r_k$ is the channel radius after k network bifurcations. This conforms to Young's Rule, proposed a century prior to Murray's derivation, for the ratio of a parent radius that bifurcates to equal child branches is equal to $2^{1/3}$. Murray's law is extended to non-circular geometries through derivations that use the hydraulic diameter in lieu of the geometric diameter and a geometry-specific Poiseuille number. For the specific case of square channel cross-sections, equation 2 is recovered.

The original derivation (equation 2) for systems with an associated volume cost applies to minimize dead volumes to conserve ink material when printing is constrained by a given pressure drop. A yet broader derivation for a constant vascular volume yields the same relationship for the radii as equation 2, indicating that any space-traversing microvascular network with Poiseuille flow will conform to Murray's law. Non-Newtonian printing inks will observe a modified optimum; however, the identical conductance (i.e., equal resistance to fluid flow) of symmetric bifurcating network branches is predicted with computational fluid modeling to route fluid flow in a manner that results in uniform deposition across the entire nozzle array.

Example 1A

Multinozzle Array Fabrication and Assembly (without Top Cap)

Multinozzle arrays may be manufactured in poly(methyl methacrylate) (PMMA) due to its ease of machining, ability to be solvent welded, and ability to withstand high pressure without deformation. PMMA polymer blocks (e.g., 2×2×0.5 in.) are mounted to a CNC-mill (8540, Sherline Products Inc.) controlled by a motion-control file specific to each design. A fly cutter is used to level the block surface relative to the CNC-mill travel motion in three dimensions. Features 508 μm or smaller are milled with a 200 μm square-end end mill (Ultra-Tool International), while features 635 μm or larger are milled with a 635 μm end mill. The channel depths are measured with an optical profilometer (LT-9010M, Keyence) and the piece is polished on a polishing wheel (Buehler Inc.) until the microchannels conform to the desired dimensions within ±2-5 μm. In particular, the microchannels are within 5 μm of the intended depth and each channel width is within ±2 μm across all 64 channels. For the 200 μm features, the observed deviation is less than 2.5% variation in width for all 64 printing nozzles, which the fluid modeling (described below) indicates is within acceptable tolerances. The sidewalls are vertical and the channel surface roughness is minimal (<1 μm).

The reservoir input(s) are machined with a 5/16" square-end drill bit and threaded with a 1/8-27 NPT tap to form a threaded hole. Alternatively, a threaded hole may be formed in a top cap, as described further below. The network may be cleaned by ultrasonication in a water bath for 15 minute intervals, with the channels washed with water between sonication steps. Any burrs that remain are removed by clearing with either a 100 μm metal syringe tip (EFD, Inc.) or a pulled glass capillary (WPI Inc.). The microchannels are completely filled with a fugitive wax (Purester 24, Strahl & Pitsch) to prevent swelling and machined channel deformation during solvent welding. Acetone, dichloromethane and commercial solvent welding products cause substantial bulk polymer flow at the solvent saturated interface, and so acetonitrile is chosen for its minimal induced distortion and negligible polymer flow under mating pressure. For a single multinozzle network printhead, a blank PMMA block (13 mm thick) is set on parafilm and acetonitrile is pipetted onto its surface. The PMMA block including the microchannel network is carefully placed in contact with the solvent while avoiding bubble entrainment, and the pieces are quickly pressed together on an isostatic press (Model C, Carver Laboratory) for 15 min or longer. For micronozzle deposition systems including multiple microchannel networks, the first PMMA block including a network is welded to a thinner PMMA block (1-3 mm thick). The welded piece is then flipped and a second block including a milled microchannel network is aligned to the first piece with a jig and subsequently solvent welded under pressure. A combination of milling and polishing are used to expose the nozzles. Each output length is measured with an optical microscope (DMI 6000B, Leica Microsystems) and polishing continues until the $k^{th}$ generation lengths are equal to within ±10 μm. Finally, the part face is recessed by ~1-2 mm, except for the multinozzle outputs and a 1 mm surrounding border.

To expand the nozzle design to allow for multi-material deposition, two microchannel networks may be created and combined within a single deposition system (printhead). The two networks may be identical in geometry but are supplied individually by two independent, separate ink reservoirs. To create these multi-ink deposition systems (e.g., see FIGS. 4a-4d), blocks containing the network features are solvent welded with an offset equal to half the center-to-center spacing (i.e., 200 μm). During printing, the interstitial spaces created by the deposition of the first ink are designed to then immediately infiltrate with the second ink. The independence of exact bifurcation of flow in these networks with respect to the specific ink allows simultaneous patterning of inks with vastly different properties.

Example 1B

Multinozzle Array Fabrication and Assembly (with Top Cap)

In a variation of the preceding fabrication process, a top cap may be employed in addition to the first and second (or first, second and third) blocks to form the multinozzle deposition system. The top cap, which may be formed of PMMA, is ultimately bonded together with the other blocks, which also may be formed of PMMA, to form a monolithic body that may be further machined to fabricate the final multinozzle deposition system.

The first block may be referred to as a channel block. In this example, the channel block is machined out of PMMA and has the following dimensions: 70 mm in width, 35 mm in height and 8 mm in thickness. There are two slots, each having a semicircular cross-section (3.175 mm in diameter), that span the entire 35 mm height. The centerline of each slot is 15.75 mm and 54.25 mm from an edge of the channel block. The microchannel network is machined in the center of a face on the channel block.

The second block, which may be referred to as a blank block, is dimensionally identical to the channel block but does not include the microchannel network (i.e., it is the same size and also has the semi-circular slots).

The top cap is machined out of PMMA and is, in this example, 70 mm wide, 16 mm deep and 12 mm thick. There is a 9 mm through hole (threaded hole) in the center of the top cap. There are two 3.175 mm through holes spaced 38.5 mm apart centered around the larger hole. These smaller through holes correspond to the semi-circular slots that are machined into the blank block and the channel block. The larger hole is threaded with a 1/8-27 NPT tap. Any burrs leftover from the machining process may be removed by spraying the top cap and/or blocks with a jet of water.

The blank and channel blocks are aligned in an aluminum jig and solvent bonded (or solvent welded) together. First, the surface of the blank block is covered with acetonitrile for about 1 minute. Next, the channel block is placed in contact with the blank block such that the face with the exposed network is touching the solvated surface. While the blocks are in contact, about 7.5 kg of weight is placed on the blocks for about 10 minutes. The weight is equivalent to 4 psi (about 29 kPa) for the given area. After the weight is removed, the two mated blocks are removed from the jig and left to sit for at least 24 hours.

The solvent bonded channel block and blank block assembly may be referred to as a bottom block. The bottom block is placed in a vise on the table of a vertical mill and oriented such that the final generation of the network is facing upward. A 6 mm square endmill is used to remove 2 mm from the surface. After removing this material, the ends of the final generation in the network are exposed to the atmosphere. Next, a 3 mm endmill machines 5 mm diameter holes, 13 mm deep centered over the centerline of the cylindrical channels formed by the two hemispherical slots on both the blank and channel blocks. These new holes form a countersink for screws that are used to attach the completed multinozzle deposition system to a printing stage.

The bottom block is then removed from the vise, flipped upside down and secured in the vice. In this orientation, the inlet of the network is facing up. A ¼" diameter chamfer endmill is used to machine a conical hole 5 mm deep.

The top cap is placed on a flat surface oriented such the centerlines of the cylindrical holes on the part are vertically oriented. A dowel rod (⅛" in diameter) is placed in the two smaller holes in the top cap. These dowel rods are used to align the top cap with the bottom block. The rods slide through the cylinders in the bottom block. The top surface of the top cap is covered with Weld-On™ 16, a commercial acrylic solvent, for about 1 minute, and then the combined channel and blank block (the bottom block) is mated to the top cap. The bottom block is oriented such that the inlet of the microchannel network is facing downward to facilitate connection with the large, tapped hole in the top cap. About 9 psi (about 62 kPa) of pressure is applied for 10 minutes. The weight is removed and the mated top cap and bottom block, or the capped monolithic body, is left to sit for at least 24 hours.

The assembly (the capped monolithic body) is machined on a mill to create a tapered shape. Before this final machining step, the body is essentially a cuboid. If the assembly was used to print in this state, ink exiting the nozzles could adhere to the bottom surface of the assembly instead of being transferred to the substrate. To promote better printing quality, the device is machined into a taper. The first taper is on the left and right side of the assembly. During these taper cuts, a triangular prism section is removed from the device. The section is 27 mm along the side and 22 mm inward towards the nozzle outputs. There is a symmetric cut on the other side. A second set of taper cuts is made on the front and back of the assembly. The cut extends 27 mm down the side and 7.5 mm inward toward the nozzle outputs. After these final cuts, the entire assembly is polished to optical clarity.

Example 2

Preparation of Ink Mixture

Microcrystalline wax ink composed of 40 w/w % microcrystalline wax (SP-19, Strahl & Pitsch Inc.) and 60 w/w % petroleum jelly (Unilever PLC.) is prepared by stirring the molten components at >100° C. The molten ink is filtered with a 25 mm diameter, 2 µm glass fiber filter (Millex AP 20 prefilter, Millipore Corp.) to remove debris and particulates. The mixture is reheated for 15 min, then the ink is poured into a pump reservoir (500D, Teledyne, Inc.) held at 82° C. by a circulating water bath. After all air bubbles float to the surface, the reservoir is sealed and all air removed prior to pressurizing to 200 psi (about 1.4 MPa) in order for the pump to compensate for ink volume reduction upon solidification. The circulating bath is slowly cooled to room temperature overnight, according to the set-points listed in Table 2.

TABLE 4

Cooling Profile Set-Points for Solidifying 500 mL of Microcrystalline Wax Ink

| Step start/end temperature ° C. | Step duration [hr:min:sec] |
|---|---|
| 82/81 | 00:01:00 |
| 81/80 | 00:10:00 |
| 80/75 | 00:45:00 |
| 75/60 | 10:00:00 |
| 60/50 | 02:00:00 |
| 50/40 | 01:00:00 |
| 40/30 | 00:45:00 |
| 30/22 | 00:15:00 |

Example 3A

High-Throughput Printing Demonstration

High-throughput printing is carried out using a 64-micronozzle array printhead that is connected via a high-pressure hose (US Hose Corporation) to an ink reservoir. The microchannel network includes channels conforming to the dimensions provided in Table 1. The surface height variance of a glass substrate is measured by an optical profilometer (LT-9010M, Keyence). The printhead is mounted to a 3-axis motion controlled stage capable of 1 m² deposition areas at speeds of up to 1 m/s (ABG10000, Aerotech Inc.). The motion program compensates for the substrate variance and as such the nozzle distance from the substrate varies ±5 µm. A microcrystalline wax ink is used for characterization tests of the deposition quality due to its low cost, bulk availability, and previous rheological characterization. Prior to flow, it is optically verified that all nozzles are clear of debris for unobstructed flow (FIG. 4a).

Figure 8A:
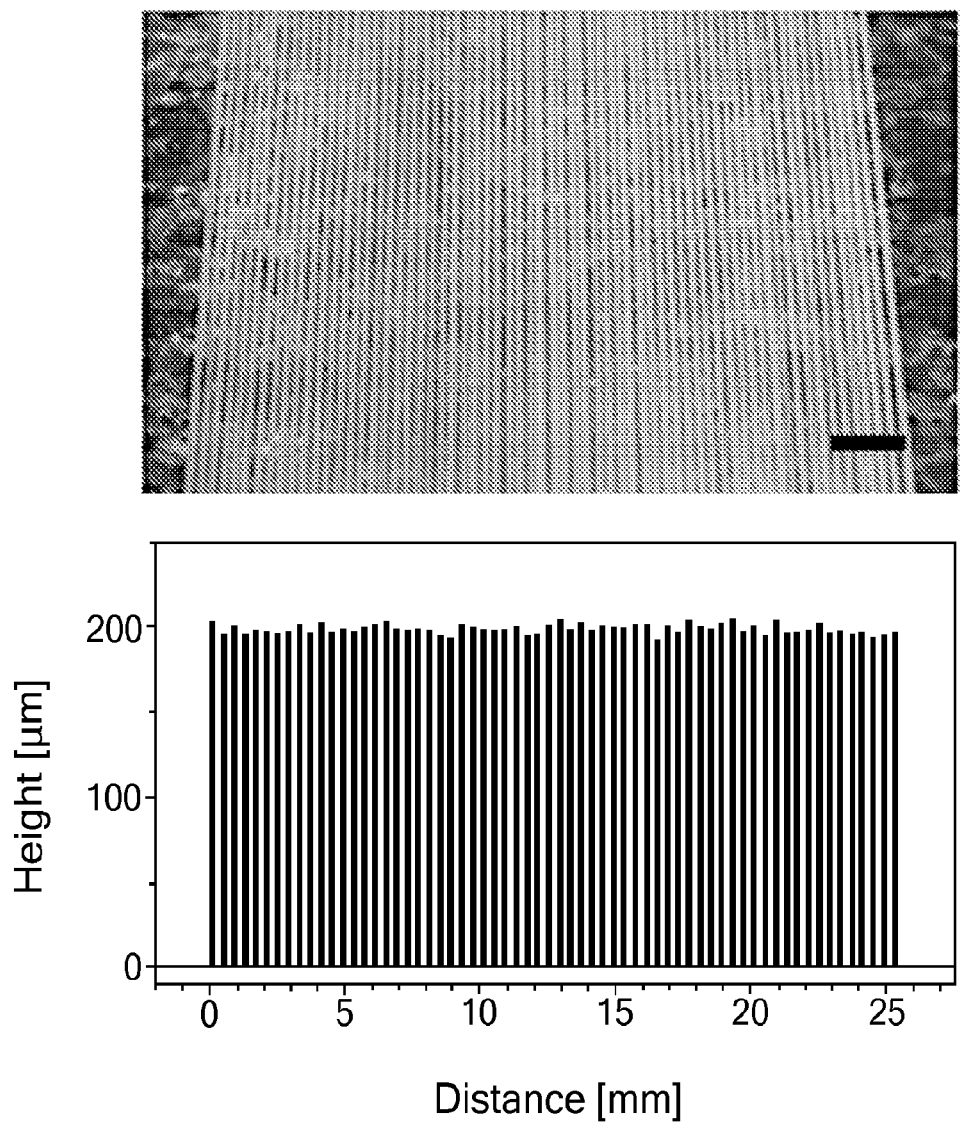
FIGS. 8a-8c show images of a single pass of 64 nozzles printing simultaneously (left) with center-to-center spacings of (FIG. 8a) 400, (FIG. 8b) 800 and (FIG. 8c) 1600 μm (scale bar=2 mm), and where the corresponding height profiles (below) are measured with a non-contact optical profilometer.
Figure 8B:
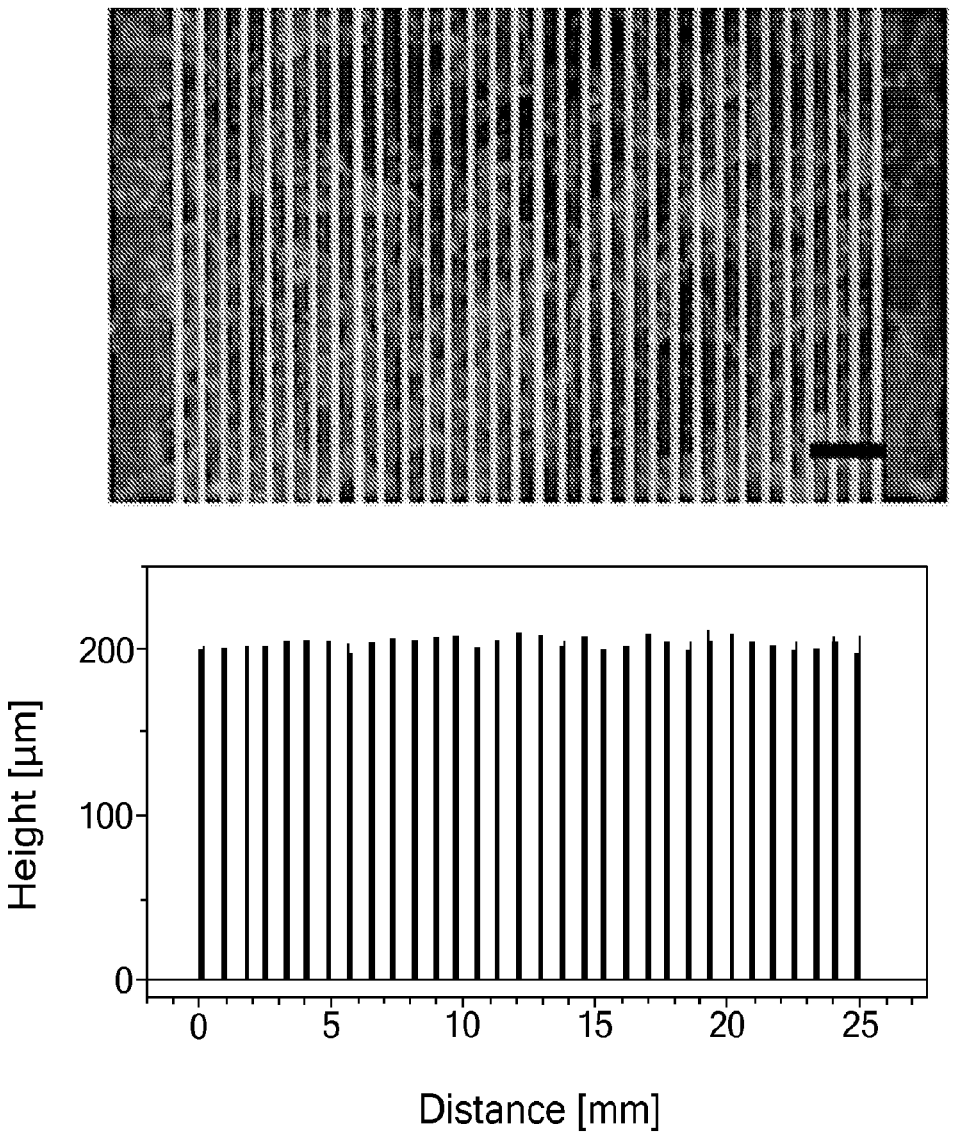
Figure 8C:
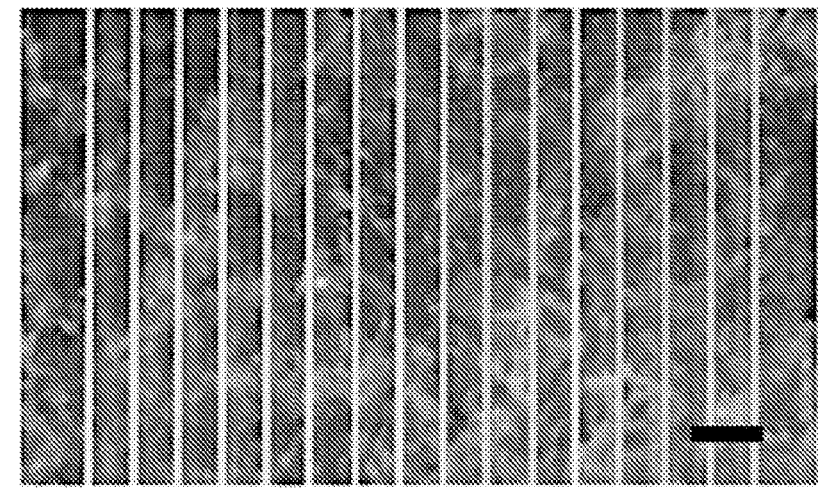
Figure 8C:
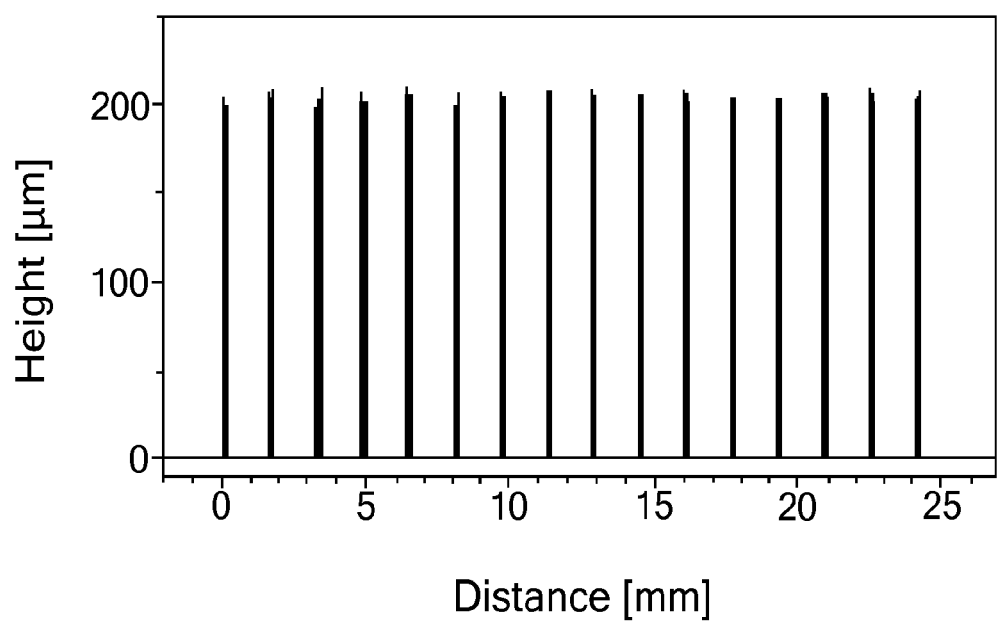

The printhead design in this example has 200 µm nozzles with a 400 µm center-to-center spacing for an anticipated 50% area coverage. The scalable deposition of filaments over large areas is successfully demonstrated over a 0.8 m² glass substrate (FIG. 7a). A single deposition pass quickly and simultaneously deposits 64 filaments (FIG. 8a) with small dimensional variation of the average filament height, $h_{avg}$, and width, $w_{avg}$ ($\sigma_h=0.025\ h_{avg}$, $\sigma_w=0.03\ w_{avg}$), measured with optical profilometry. Deposition from similar printheads with 200 µm nozzles but either 800 µm (FIG. 8b) or 1600 µm (FIG. 8c) center-to-center spacings also exhibit uniform and continuous filamentary deposition. Filaments are successfully deposited for velocities ranging over an order of magnitude (~1-20 mm s$^{-1}$) while maintaining high profile fidelity. The effective single-nozzle print velocity, 1.25 m s$^{-1}$, is ~20 times faster than typical single-nozzle printing and is faster than the maximum motion capability of the deposition stage. Material is deposited at velocities and applied pressures of 1-20 mm/s and 2-4 MPa, respectively.

Example 3B

High-Throughput Printing Demonstration

In this example of high-throughput printing, the microchannel network includes channels conforming to the dimensions provided in Table 2. As above, printing is carried out using a 64-micronozzle array printhead that is connected via a high-pressure hose (US Hose Corporation) to an ink reservoir. The surface height variance of a glass substrate is measured by an optical profilometer (LT-9010M, Keyence). The printhead is mounted to a 3-axis motion controlled stage capable of 1 m² deposition areas at speeds of up to 1 m/s (ABG10000, Aerotech Inc.). The motion program compensates for the substrate variance and as such the nozzle distance from the substrate varies ±5 µm. A microcrystalline wax ink is used for characterization tests of the deposition quality due to its low cost, bulk availability, and previous rheological characterization. Prior to flow, it is optically verified that all nozzles are clear of debris for unobstructed flow.

The printhead design in this example has 200 µm nozzles with a 200 µm center-to-center spacing. The printhead is operated at an applied pressure of about 5 MPa and achieves a printing velocity of about 40 mm/s.

Example 4

Computational Fluid Modeling

Ink flow uniformity is important for achieving high quality and consistently patterned features. Disparities in the dimensions of the fabricated network junctions may reduce flow uniformity between channels within a specific generation and all subsequent generations. The effect of these geometric imperfections on ink flow is investigated using computational fluid modeling.

Figure 9A:
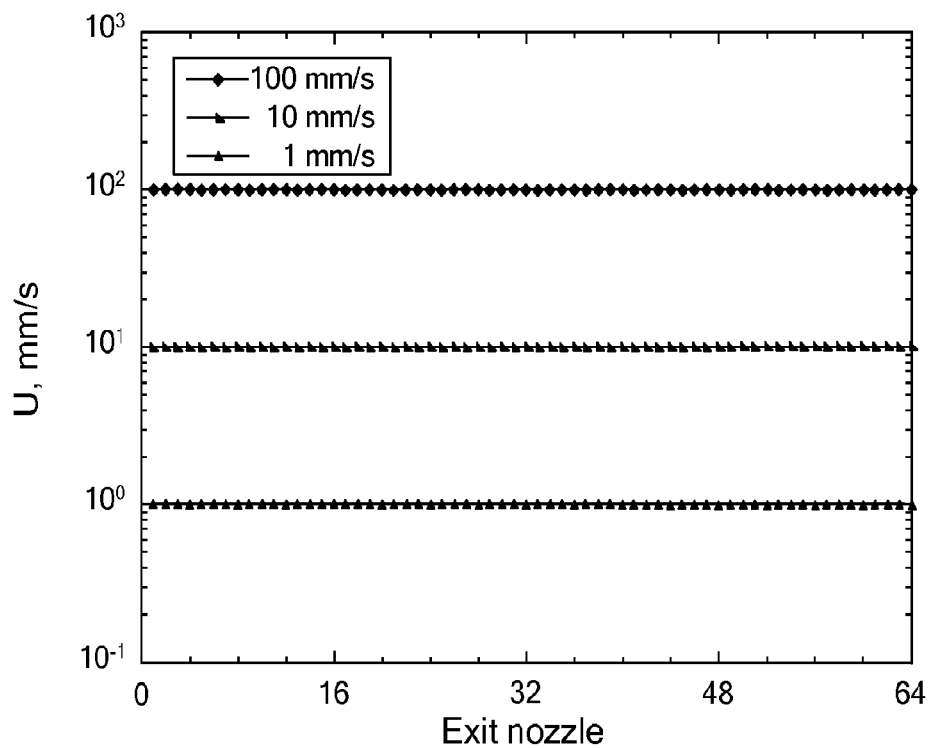
FIGS. 9a-9c provide graphs of computational fluid modeling results for (FIG. 9a) water and (FIG. 9b) glycerol for $U_{mean} \sim 1\text{-}100$ mm s$^{-1}$, and (FIG. 9c) microcrystalline wax ink fluids flowing at $U_{mean} \sim 10$ mm s$^{-1}$, where the standard deviation of nozzle flow is $<0.001 U_{mean}$ for water, $<0.0008 U_{mean}$ for glycerol, and $0.002 U_{mean}$ for the microcrystalline wax.
Figure 9B:
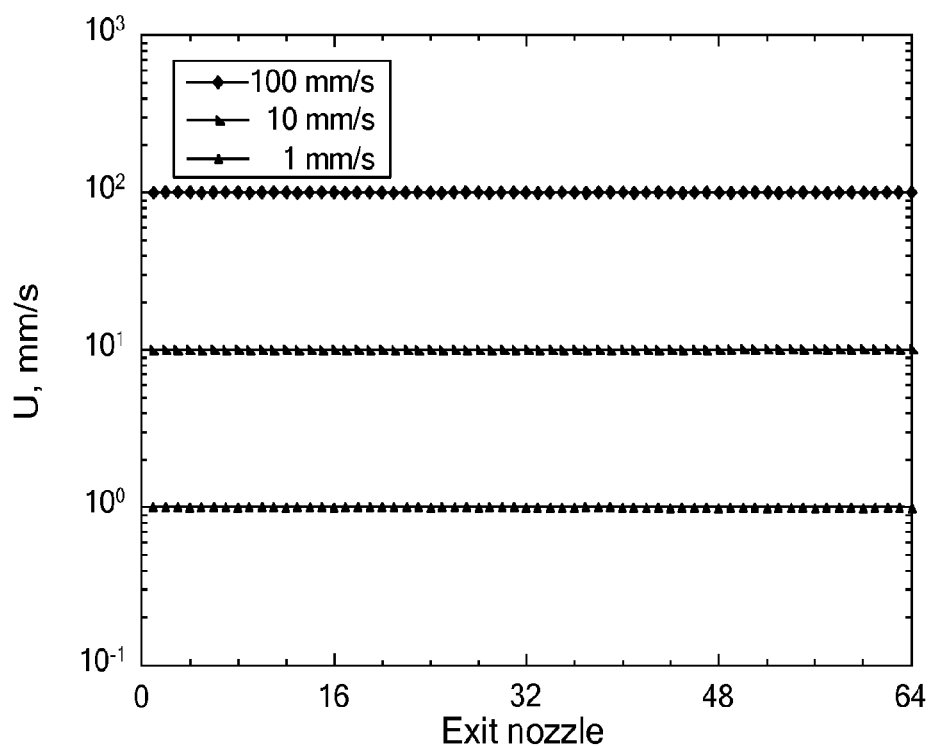
Figure 9C:
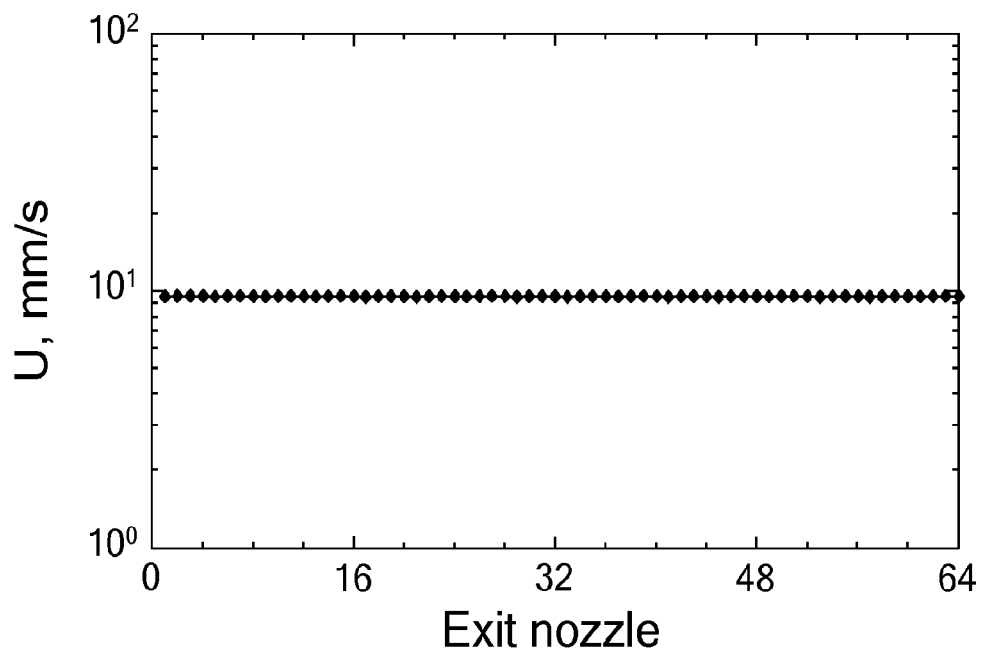
Figure 9D:
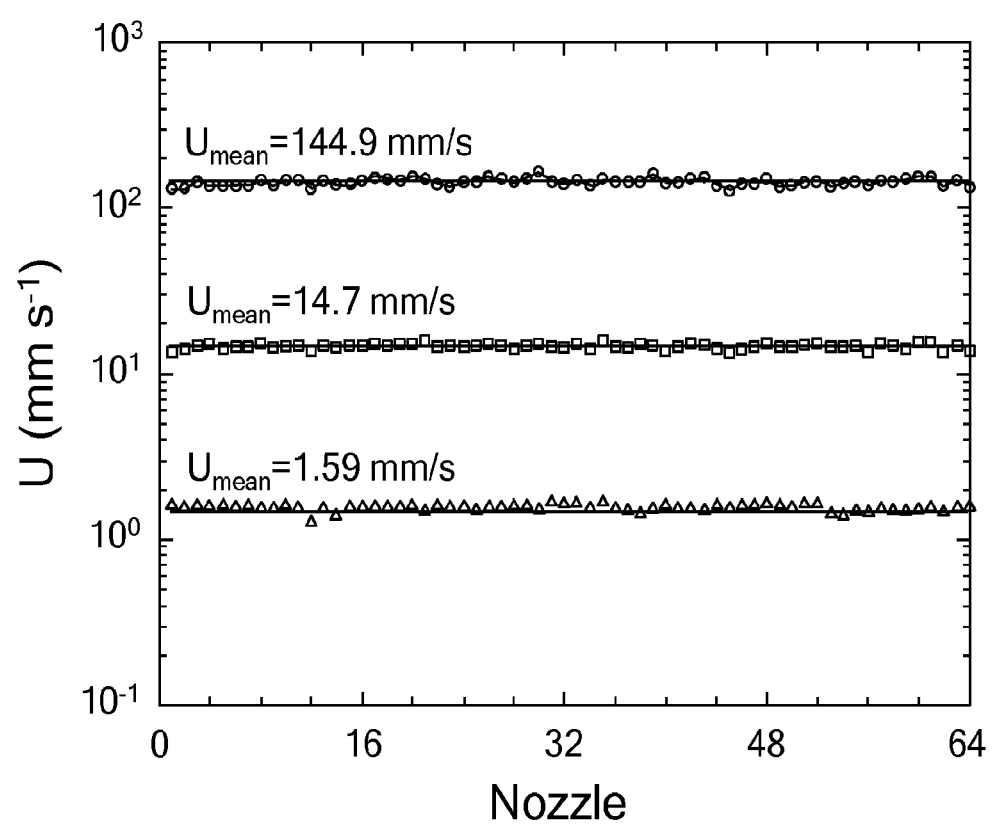
FIG. 9d shows average axial velocity U measured by μ-PIV for each of the 64 outlet channels for input flow rates spanning 2 orders of magnitude, where the solid lines denote the computational fluid model results for the corresponding input flow rates.
Figure 9E:
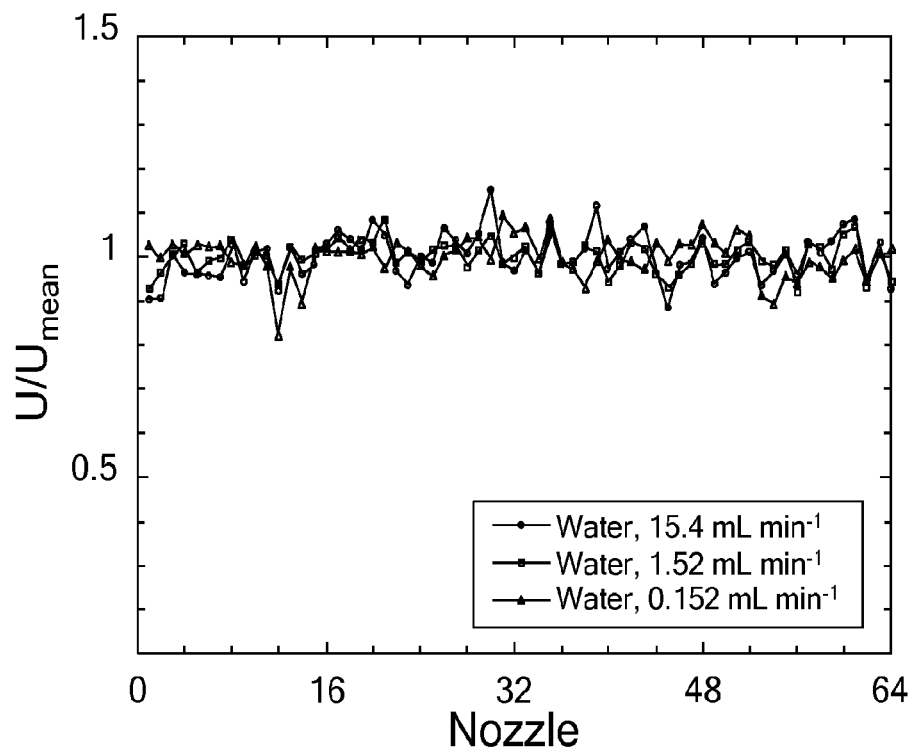
FIG. 9e shows channel velocities (U) normalized by average velocity of all channels ($U_{mean}$)
Figure 9F:
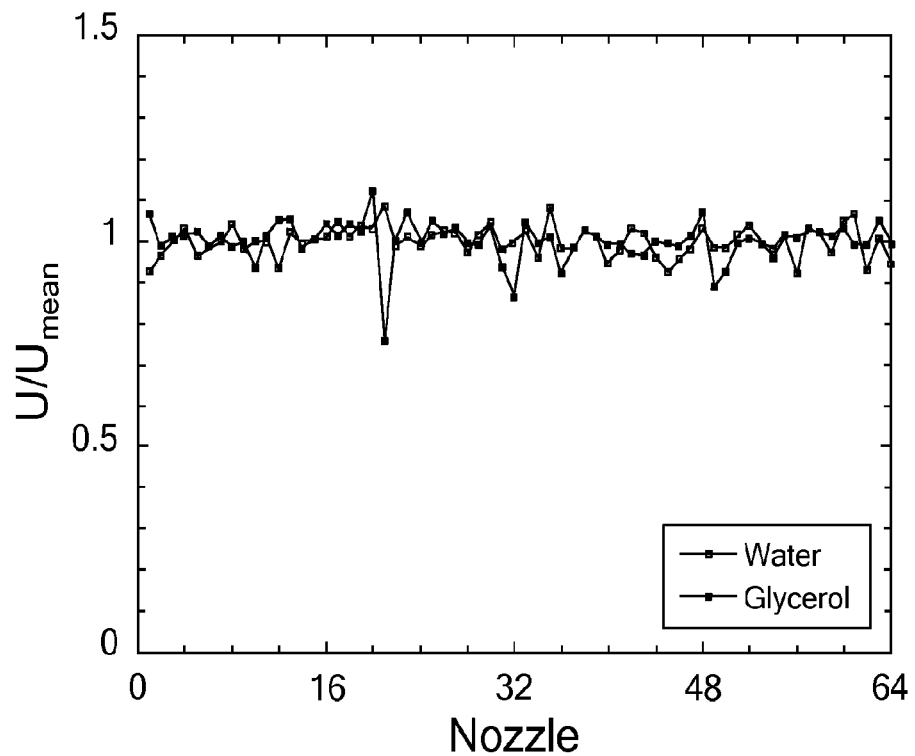
FIG. 9f shows the distribution of the normalized velocity for both water ($_{polystyrene}=0.00024$) and glycerol ($_{polystyrene}=0.0003$) at an input flow rate of 1.52 mL min$^{-1}$.

A 3D finite volume element model of the multinozzle geometry is created, modified, and meshed in GAMBIT (ANSYS Inc.). The boundary conditions consist of a constant mass flow into the inlet, a constant pressure at the outlets, and a no-slip condition at the channel walls. The modeling is carried out with ANSYS FLUENT (v. 13, ANSYS Inc.) using Newtonian fluid models for either water or glycerol and a non-Newtonian power law fluid model for fugitive organic ink, according to the equation $\eta(\gamma)=K\gamma^{s-1}$ where the consistency parameter (K) and power law parameter (n) were determined experimentally from $\eta(\gamma)$. For the case of Newtonian flow in a perfectly symmetric bifurcating geometry, the model predicts that uniform flow (i.e., $\sigma<0.001U_{mean}$) is achieved for steady-state laminar conditions over a wide range of typical printing velocities (1-100 mm s$^{-1}$) for both water and glycerol fluids, as shown in FIGS. 9a-9c. The modeled flow velocity is averaged on a channel midplane at the nozzle exit for comparison to the results of microscopic particle image velocimetry (µ-PIV) flow experiments, which are described below and shown in FIGS. 9d-9f. The volumetric flow rate is reported, as this parameter is paramount to ensure the uniformity of the as-printed ink filaments.

Figure 10A:
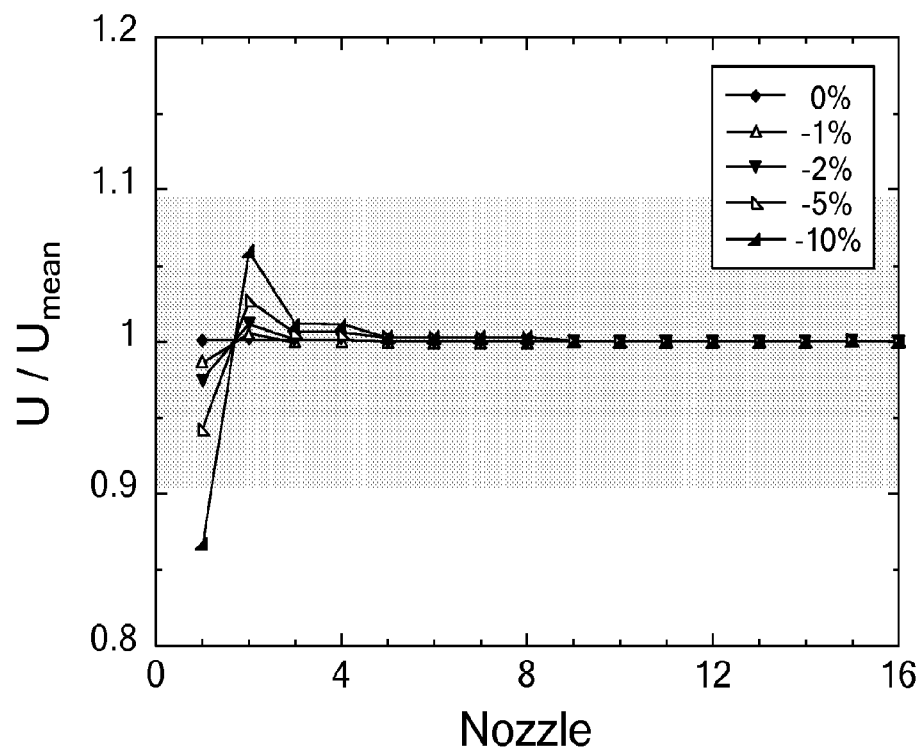
FIG. 10a shows a modeled water volumetric flow rate normalized by the mean of all 64 nozzles, where channel 1 deviates from its 200 μm width by 0-10%.
Figure 10:
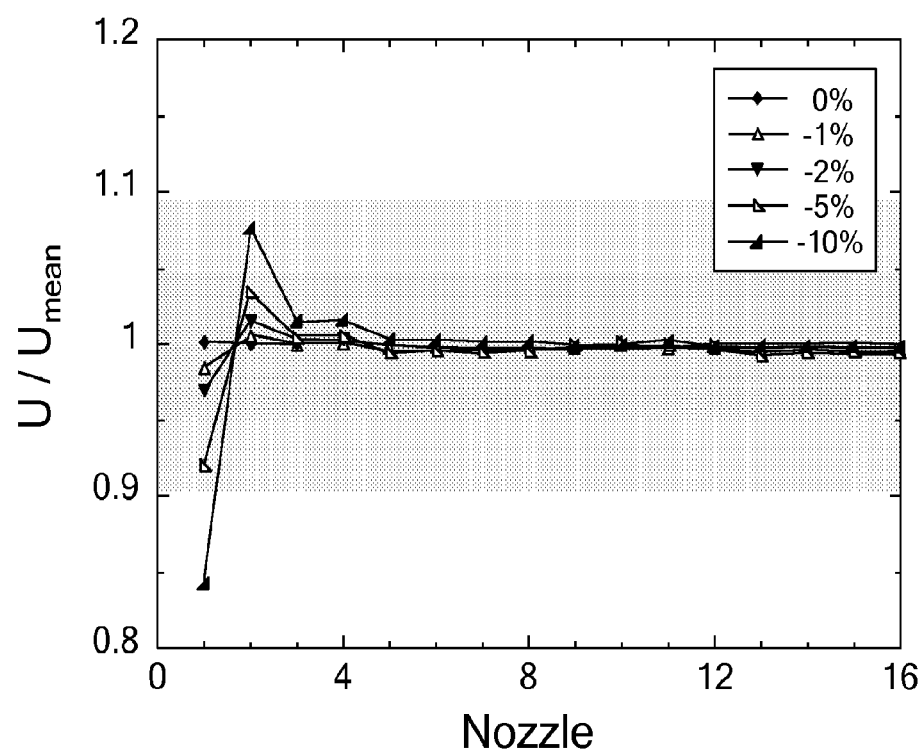
FIG. 10b shows a modeled wax area flow rate normalized by the mean of all 64 nozzles, where channel 1 deviates from its 200 μm width by 0-10%.

To evaluate the effects of microchannel non-uniformity within the multinozzle arrays, the width of a single channel is systematically varied and the resulting volumetric flow rate deviation(s) is measured in a network including six generations and a total of 64 channels. As the width of the first channel ("channel 1") is decreased by 1-10% while the width of channels 2-64 remain fixed, simulations of water reveal that the volumetric flow rate through channel 1 decreases monotonically, as illustrated in FIG. 10a. The water volume diverted from channel 1 is primarily routed to its neighboring channel (channel 2) in the same bifurcation generation. However, some additional flow is rerouted at the previous bifurcation generation (generation 5) and flow increases in channels 3 and 4. Channels further removed from the modified channel appear to have negligible alteration to their flow rate.

Direct ink writing may utilize viscoelastic inks that have a viscosity with a non-linear shear dependence. The effect of this distinct rheology on the flow uniformity within asymmetric networks is simulated for a microcrystalline wax ink that is often used in direct write assembly and which conforms to a power law fluid model. As the channel 1 width is decreased by 1-10% (FIG. 10b), the resulting flow profiles indicate that the viscoelastic ink can be printed with nozzles that have dimensional changes of up to 5% (e.g., 10 µm for a 200 µm nozzle) before the flow profile deviates from the mean velocity by greater than 10%. This deviation value is empirically observed to be the maximum flow rate variation for continuous ink filament deposition. While the results are qualitatively similar to the Newtonian fluids, the viscoelastic ink diverts ~20% greater flow relative to water for a given channel width constriction.

Example 5

µ-PIV Measurements

Figure 11A:
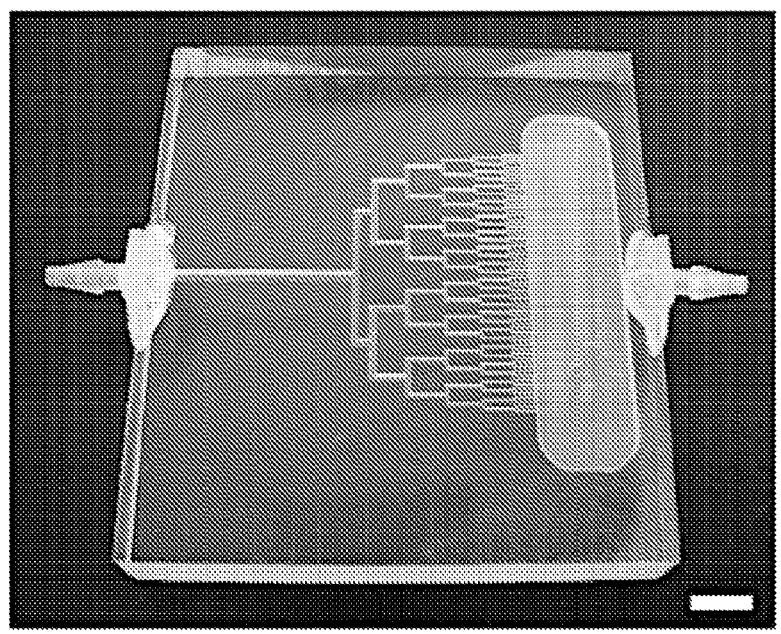
FIG. 11a shows a multinozzle deposition system modified to include a reservoir to collect fluid during μ-PIV experiments (scale bar=5 mm)

To validate the flow distribution profile of the hierarchical bifurcating microvascular network design, µ-PIV is used to determine fluid velocities within individual channels. This technique determines instantaneous fluid velocity fields by correlating fluorescent particle positions in pairs of time-delayed images.

µ-PIV measurements are carried out on microvascular nozzle arrays that are modified to include a collection reservoir that captures the flow output (see FIG. 11a). The surface is encapsulated with a clear pressure-sensitive adhesive layer (3M Inc.) and all channels are verified by optical microscopy to be free of debris. For high viscosity fluids that cause adhesive layer debonding, the layer is reinforced in the reservoir region by adhering a glass slide with a UV-curable adhesive (NOA 61, Norland Products Inc.). Suspensions of either deionized water or glycerol with 1.0 µm dyed polystyrene particles (Nile red, F-8819, Invitrogen) are prepared (=0.024-0.03 v/v %) and loaded in 60 mL syringes (BD Syringe). The flow rate of the syringe pump (PHD2000, Harvard Apparatus) is calibrated by collecting data in LabView (v. 2009, National Instruments) while water flows through the device to a balance (AG285, Mettler Toledo) in a humidity-controlled chamber.

Measurements are taken for a constant suspension flow rate after an initial start-up transient. A double-pulsed Nd:YAG laser (Solo PIV, New Wave Research) is directed through a 10× objective (N.A.=0.30) on an upright microscope (Olympus BX60) to illuminate the region of interest. The particle light emission ($\lambda_{peak}$=575 nm) is captured by a CCD camera (11 MP PowerView Plus, TSI). The µ-PIV images are collected with a time delay between successive image pairs sufficient to yield particle displacements in excess of 8 pixels. The images are interrogated with a two-frame cross correlation method with a vector grid spacing of $\Delta x=\Delta y=26.976$ μm. These parameters yield calculated vectors that represent the ensemble x-direction velocity in each microchannel midplane.

Figure 11B:
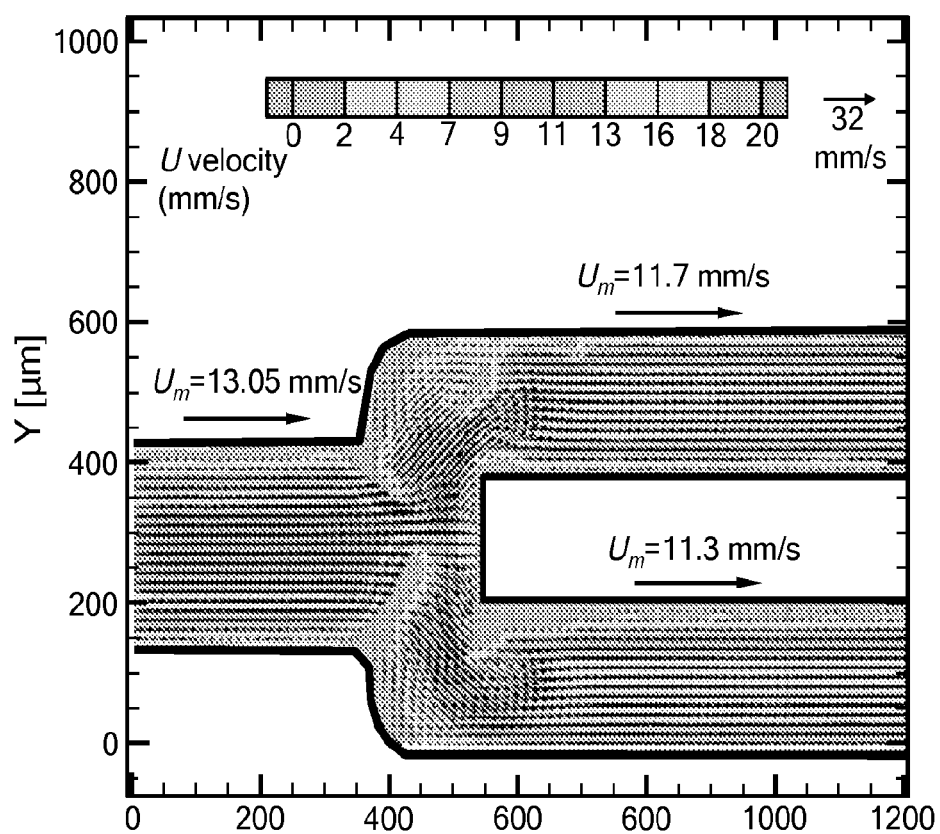
FIG. 11b shows a result of fluid flow tracking, in particular the ensemble average vector field from μ-PIV; axial flow is well characterized, except for the bifurcation junction where excess background fluorescence precludes particle cross-correlations.

The channel flow uniformity is interrogated with Newtonian fluid suspensions with dilute concentrations of latex particles. Typical filamentary deposition occurs over a broad range of printing speeds, often 1 to 100 mm s$^{-1}$. To determine the effect of flow velocity on the equal distribution of fluid among nozzles, aqueous suspension input flow rates are chosen to span the two orders of magnitude of filamentary deposition velocities. The average individual velocities for all 64 nozzles are shown for target printing rates of ~1, 10 and 100 mm s$^{-1}$ in FIG. 11$b$. For each flow velocity, the standard deviation as a fraction of the mean velocity $U_{mean}$ (1.59, 14.7, and 144.3 mm s$^{-1}$) is within ±5%, as shown in FIG. 9$d$. This flow variation is close to the 1-5% volumetric flow variation of the syringe pump, as measured for 60 second bins of the flow rate. Some flow variation is likely due to imperfections of the fabricated microvascular geometry. Air bubbles, which often nucleate within the channels and need to periodically be flushed from the system, may be an additional source of variation. Due to the large lengths of channel in the bifurcating network, it is not possible to scan the entire array for microbubbles (i.e., less than ~25 μm), but rather bubbles are expelled when they are visible to the eye (i.e., greater than ~50 μm). Printable inks, however, do not nucleate bubbles. Despite a rigorous filtering procedure, some debris (e.g., hair or fibers) may remain in the ink, which, when trapped at bifurcations, can divert flow and reduce flow uniformity within the nozzle array.

Direct write inks may be substantially more viscous than these aqueous suspensions and may experience greater flow nonuniformity or a given constriction. To investigate the effect of viscosity on the flow distribution, a glycerol suspension with a viscosity μ of 832 cP at 22° C. is flowed through the microvascular network. The glycerol viscosity is approximately three orders of magnitude greater than that of the aqueous suspensions (μ=1 cP) and results in a concomitant decrease in Reynolds number (Re) ($Re_{glycerol}$=0.0023, $Re_{aqueous}$=2.2). For typical power law fluid inks, a comparable viscosity at the wall-fluid interface is estimated for deposition rates as low as 4.5 mm s$^{-1}$, though an unyielded core is expected to remain for substantially higher velocities. For a target printing rate of ~10 mm s$^{-1}$, the glycerol flow distribution ($U_{mean}$=15.0 mm s$^{-1}$, $\sigma$=0.052$U_{mean}$) is comparable to that of water ($U_{mean}$=14.7 mm s$^{-1}$, $\sigma$=0.036$U_{mean}$). The difference in standard deviation is minimal, indicating that the two orders of magnitude difference in Re does not significantly affect flow uniformity.

Example 6

Multimaterial Deposition With Two Different Inks

The multinozzle printhead design may include two microchannel networks capable of multi-material deposition, as described above. The two networks may be identical in geometry and be supplied by a separate ink reservoir. In this example, two identical blocks with channel networks milled into their faces are solvent welded to opposite sides of a flat centerpiece. Their features are transversely offset with respect to the intended printing direction by a distance equal to half the nozzle center-to-center spacing. During printing, the interstitial spaces created by the deposition of the first ink are then quickly infiltrated with the second ink. The internal registration of this design eliminates alignment errors commonly observed in multiple material deposition.

A fully dense structure may be printed from two microcrystalline wax inks that flow through a dual-network printhead. The resulting multilayer structure may be a 3D, bicontinuous structure composed of the two wax inks.

In summary, the successful fabrication of and deposition from microvascular multinozzle printheads has been demonstrated. The symmetric, bifurcating structures may conform to the biological principle of Murray's law to minimize viscous resistance during deposition. Computational fluid modeling shows uniform flow through the networks for both Newtonian and non-Newtonian fluids and defines the dimensional tolerances for the smallest generation features. μ-PIV flow experiments demonstrate that the flow is sufficiently uniform for filamentary printing. Patterning of parallel filamentary features with multinozzle printheads results in a nearly two order of magnitude printing rate increase, demonstrating a manufacturing speed advantage that can be scaled yet further by increasing the number of bifurcating generations. The demonstrated ability to pattern polymeric gel inks, as well as traditional low viscosity liquids, attest to the vast range of materials suitable for this technique.

Although the present invention has been described with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

We claim:

1. A method of high-throughput printing, the method comprising:
   providing a multinozzle deposition system comprising:
      a body including a first network of microchannels embedded therein, the first network of microchannels extending from a parent microchannel through a series of furcations to a plurality of branching microchannels, the series consisting of k generations with furcation number m where the k$^{th}$ generation includes m$^k$ branching microchannels, a first end of the body including a single inlet to the parent microchannel and a second end of the body including m$^k$ outlets from the branching microchannels, where k is an integer greater than or equal to 1 and where m is an integer greater than or equal to 2, the outlets being positioned proximate a substrate;
   flowing a first ink into the single inlet at a pressure of at least about 2 MPa, the first ink passing through the first network of microchannels and through the outlets; and
   depositing m$^k$ filaments of the first ink simultaneously on the substrate at a printing speed of at least about 1 mm/s.

2. The method of claim 1, wherein the body further comprises a second network of microchannels embedded therein, the second network of microchannels extending from a second parent microchannel through a progression of furcations to a plurality of second branching microchannels, the progression consisting of k generations with furcation number m where the k$^{th}$ generation of the progression includes m$^k$ second branching microchannels, the first end of the body including a single inlet to the second parent microchannel and the second end of the body including m$^k$ outlets from the second branching microchannels, where k is an integer greater than or equal to 1 and m is an integer greater than or equal to 2, the outlets from the second branching microchannels being positioned proximate the substrate; and further comprising flowing a second ink into the single inlet to the second parent microchannel, the second ink passing through the second network of microchannels and through the outlets of the second network; and depositing $m^k$ filaments of the second ink simultaneously on the substrate at a printing speed of at least about 1 mm/s.

3. The method of claim 2, where the $m^k$ filaments of the second ink are deposited in interstices defined by the deposition of the $m^k$ filaments of the first ink.

4. The method of claim 2, wherein the depositing of the $m^k$ filaments of the second ink occurs simultaneously with the depositing of the $m^k$ filaments of the first ink.

5. The method of claim 2, wherein the second ink is flowed into the single inlet to the second parent microchannel at a pressure of at least about 2 MPa.

6. The method of claim 2, wherein the first ink is different from the second ink.

7. The method of claim 2, further comprising forming a fully dense structure from the $m^k$ filaments of the first ink and the $m^k$ filaments of the second ink on the substrate.

8. The method of claim 1, wherein the first ink comprises a polymer selected from the group consisting of PDMS and epoxy.

9. A method of high-throughput printing, the method comprising:

providing a multinozzle deposition system comprising:

a body including a first network of microchannels embedded therein, the first network of microchannels extending from a parent microchannel through a series of furcations to a plurality of branching microchannels, the series consisting of k generations with furcation number m where the $k^{th}$ generation includes $m^k$ branching microchannels, a first end of the body including a single inlet to the parent microchannel and a second end of the body including $m^k$ outlets from the branching microchannels, where k is an integer greater than or equal to 1 and where m is an integer greater than or equal to 2, the outlets being positioned proximate a substrate;

flowing a first ink into the single inlet, the first ink passing through the first network of microchannels and through the outlets; and depositing $m^k$ filaments of the first ink simultaneously on the substrate at a printing speed of at least about 1 mm/s, wherein the first ink comprises a polymer selected from the group consisting of PDMS and epoxy.

10. A method of direct write assembly, the method comprising:

providing a multinozzle deposition system comprising:

a body including a first network of microchannels embedded therein, the first network of microchannels extending from a parent microchannel through a series of furcations to a plurality of branching microchannels, the series consisting of k generations with furcation number m where the $k^{th}$ generation includes $m^k$ branching microchannels, a first end of the body including a single inlet to the parent microchannel and a second end of the body including $m^k$ outlets from the branching microchannels, where k is an integer greater than or equal to 1 and where m is an integer greater than or equal to 2, the outlets being positioned proximate a substrate;

flowing a first ink into the single inlet, the first ink passing through the first network of microchannels and through the outlets; and depositing $M^k$ filaments of the first ink simultaneously on the substrate at a printing speed of at least about 1 mm/s, thereby fabricating a structure by direct writing.

* * * * *